United States Patent
Nguyen

(10) Patent No.: US 9,484,947 B1
(45) Date of Patent: Nov. 1, 2016

(54) VARIABLE LENGTH DYNAMIC ELEMENT MATCHING IN DIGITAL-TO-ANALOG CONVERTERS

(71) Applicant: ANALOG DEVICES, INC., Norwood, MA (US)

(72) Inventor: Khiem Quang Nguyen, Tewksbury, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/869,154

(22) Filed: Sep. 29, 2015

(51) Int. Cl.
*H03M 1/06* (2006.01)
*H03M 1/70* (2006.01)
*H03M 1/08* (2006.01)
*H03M 1/74* (2006.01)
*H03M 1/00* (2006.01)

(52) U.S. Cl.
CPC .............. *H03M 1/70* (2013.01); *H03M 1/089* (2013.01); *H03M 1/0845* (2013.01); *H03M 1/00* (2013.01); *H03M 1/747* (2013.01)

(58) Field of Classification Search
CPC ............................... H03M 1/00; H03M 1/747
USPC .................. 341/118, 144, 142, 150; 375/252
See application file for complete search history.

(56) References Cited

U.S. PATENT DOCUMENTS

| | | | |
|---|---|---|---|
| 7,777,658 B2 | 8/2010 | Nguyen et al. | |
| 7,812,753 B1 | 10/2010 | Myles et al. | |
| 8,842,032 B2 | 9/2014 | Nguyen et al. | |
| 2015/0048959 A1* | 2/2015 | Zhu ..................... | H03M 1/0617 341/118 |
| 2015/0171891 A1 | 6/2015 | Stoops et al. | |

OTHER PUBLICATIONS

Khiem Nguyen et al., "A 108 dB SNR, 1.1 mW Oversampling Audio DAC With a Three-level DEM Technique", IEEE Xplore Abstract, IEEE.org, Sep. 9, 2015, 2 pages.

* cited by examiner

*Primary Examiner* — Joseph Lauture
(74) *Attorney, Agent, or Firm* — Patent Capital Group

(57) ABSTRACT

Embodiments of the disclosure provide improved mechanisms for applying DEM techniques to a DAC comprising a plurality of cells. Disclosed mechanisms include keeping track of the amplitude of input digital signal over a certain time period to determine a range of amplitudes of a portion of the input signal, and, when converting the digital values of that portion to analog values and applying a particular DEM technique, limiting the number of DAC cells on which a DEM technique is applied only to a number that is necessary for generating the analog output corresponding to the tracked portion, which number is determined based on the tracked amplitudes and could be smaller than the total number of DAC cells. In this manner, mismatch error may be reduced for smaller input signal amplitudes. Whenever possible, unused DAC cells may be put into a power saving mode, providing the advantage of reduced power consumption.

30 Claims, 17 Drawing Sheets

VARIABLE LENGTH DYNAMIC ELEMENT MATCHING IN DIGITAL-TO-ANALOG CONVERTERS

TECHNICAL FIELD OF THE DISCLOSURE

The present disclosure relates generally to digital-to-analog converters and, more particularly, to methods and systems for controlling application of dynamic element matching techniques in digital-to-analog converters.

BACKGROUND

Real-world analog signals such as temperature, pressure, sound, or images are routinely converted to a digital representation that can be easily processed in modern digital systems. In many systems, this digital information must be converted back to an analog form to perform some real-world function. The circuits that perform this step are digital-to-analog converters (DACs), and their outputs may be used to drive a variety of devices. Loudspeakers, video displays, motors, mechanical servos, radio frequency (RF) transmitters, and temperature controls are just a few diverse examples. DACs are often incorporated into digital systems in which real-world signals are digitized by analog-to-digital converters (ADCs), processed, and then converted back to analog form by DACs. In these systems, the performance required of the DACs will be influenced by the capabilities and requirements of the other components in the system.

As with many other devices fabricated using complicated manufacturing processes, one factor affecting the performance of DACs includes variations, referred to in the following as a "mismatch," in performance of individual elements of a DAC (referred to herein as a "DAC cell") due to manufacturing variations, typically referred to as a "static mismatch" or/and various types of drifts, e.g. thermal drift, caused by operation of a device, typically referred to as a "dynamic mismatch". Improvements could be made with respect to addressing this issue.

OVERVIEW

Embodiments of the present disclosure provide mechanisms for digitally correcting or minimizing a mismatch of a DAC that includes a plurality of DAC cells. Mechanisms described herein may be applicable to current steering as well as switched capacitor DACs, implemented using various architectures, such as e.g. sigma-delta or Nyquist DAC architectures. Some of the mechanisms described herein may be especially attractive for oversampling sigma-delta audio DAC applications. Furthermore, mechanisms described herein are applicable to two-level DACs as well as to three-level DACs.

As used herein, the term "DAC cell," sometimes also referred to as "DAC unit" or a "DAC element," refers to an analog element such as a current source or a switched capacitor element that delivers an analog quantity such as charge or current. For example, in context of a two-level current steering DAC, a DAC cell may comprise a DAC element that includes two current sources, e.g. a pMOS and an nMOS current sources, as well as two switching mechanisms referred to herein as "switches" b and b_bar, associated with each of the two current sources (i.e. in total of four switches per DAC cell). In another example, in context of a three-level current steering DAC, a DAC cell may comprise a DAC element that includes two current sources, e.g. a pMOS and an nMOS current sources, as well as three switching mechanisms referred to herein as "switches" b, b_bar, and z, associated with each of the two current sources (i.e. in total of six switches per DAC cell). In another context, a DAC cell is an element that can deliver a charge Q equal to the product of a pre-defined reference voltage Vref and a capacitance C. The polarity of this charge is defined by the digital input to the DAC cell.

In Example 1, one aspect of the present disclose provides a method for controlling application of one or more dynamic element matching (DEM) techniques in a DAC that includes a plurality of DAC cells. The method includes determining a range of amplitudes of a portion of an input signal provided or to be provided to the DAC and determining a number of DAC cells, less than a number of all DAC cells within the plurality of DAC cells, corresponding to the determined range of amplitudes of the portion of the input signal (i.e. the number of DAC cells necessary for generating the analog output corresponding to the portion of the input digital signal). The method further includes limiting application of the one or more DEM techniques to the determined number of DAC cells.

In Example 2, the method according to Example 1 may further include a step of determining whether the range of amplitudes of the portion of the input signal is smaller than a threshold value. In such embodiments, the number of DAC cells may be determined based on the threshold value when it is determined that the range of amplitudes of the portion of the input signal is smaller than the threshold value.

In Example 3, in the method according to Example 2, the threshold value may be one of a plurality of threshold values. In such embodiments, determining whether the range of amplitudes of the portion of the input signal is smaller than the threshold value may include determining whether the range of amplitudes of the portion of the input signal is smaller than the threshold value for two or more of the plurality of threshold values. The number of DAC cells may then be determined based on the smallest threshold value of the plurality of threshold values for which it was determined that the range of amplitudes of the portion of the input signal is smaller than the threshold value.

In Example 4, in the method according to Example 3, the plurality of threshold values may be predefined. Similarly, the number of DAC cells may be predefined for each of (i.e. corresponding to) the threshold values. In other words, in such embodiments, there is one to-one correspondence between the number of predefined threshold values and the number of DAC cells in a subset of DAC cells on which DEM technique is to be applied.

In Example 5, in the method according to any one of the Examples described herein, following the limitation of the application of the one or more DEM techniques to the determined number of DAC cells, the method may further include determining a further range of amplitudes of a further portion of the input signal and removing the limitation (i.e. applying the one or more DEM techniques to all of the plurality of DAC cells) when the further range of amplitudes is determined to be equal to or greater than a threshold value.

In Example 6, in the method according to any one of the Examples described herein, the threshold value may be equal to a full scale of the DAC or a fraction of the full scale of the DAC, e.g. ½ of a full scale, ¼, of a full scale, etc.

In Example 7, in the method according to any one of the Examples described herein, the method may further include ensuring that the application of the one or more DEM techniques begins to be limited to the determined number of DAC cells starting from a time when a cumulative error due to mismatch of the plurality of DAC cells satisfies one or more criteria. In Example 8, the one or more criteria may e.g. include that the cumulative error is equal to zero or the cumulative error being within a predefined range, the predefined range comprising zero.

In Example 9, in the method according to any one of the Examples described herein where three-level DAC cells are involved, the DAC may include a signed thermometer encoder for converting a plurality of signed binary data received at the encoder into a plurality of signed thermometer data, where positive binary data are converted into positive thermometer data and negative binary data are converted into negative thermometer data. In such embodiments, the cumulative error may be determined to satisfy the one or more criteria (e.g. the criteria being that the cumulative error is equal to zero) when a starting position of next positive thermometer data is the same as a starting position of next negative thermometer data.

In Example 10, in the method according to any one of the Examples described herein where two-level DAC cells are involved, the cumulative error may be determined to satisfy the one or more criteria (e.g. the criteria being that the cumulative error is equal to zero) when a current pointer indicating a starting position of applying the one or more DEM techniques overlaps (i.e. is equal to) a predefined reference pointer.

In Example 11, in the method according to any one of the Examples described herein where three-level DAC cells are involved, the method may further include turning DAC cells of the plurality of DAC cells unused for the limited application of the one or more DEM techniques off.

Because mechanisms described herein involve varying the number of DAC cells of a DAC on which DEM techniques are applied, these mechanisms may be referred to as "variable length DEM" mechanisms.

As will be appreciated by one skilled in the art, aspects of the present disclosure may be embodied in various manners—e.g. as a method, a system, a computer program product, or a computer-readable storage medium. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "circuit," "module" or "system." Functions described in this disclosure may be implemented as an algorithm executed by one or more processing units, e.g. one or more microprocessors, of one or more computers. In various embodiments, different steps and portions of the steps of each of the methods described herein may be performed by different processing units. Furthermore, aspects of the present disclosure may take the form of a computer program product embodied in one or more computer readable medium(s), preferably non-transitory, having computer readable program code embodied, e.g., stored, thereon. In various embodiments, such a computer program may, for example, be downloaded (updated) to the existing devices and systems (e.g. to the existing DACs or DAC controllers, etc.) or be stored upon manufacturing of these devices and systems.

Other features and advantages of the disclosure are apparent from the following description, and from the claims.

DESCRIPTION OF EXAMPLE EMBODIMENTS OF THE DISCLOSURE

Basics of DACs

Figure 1:
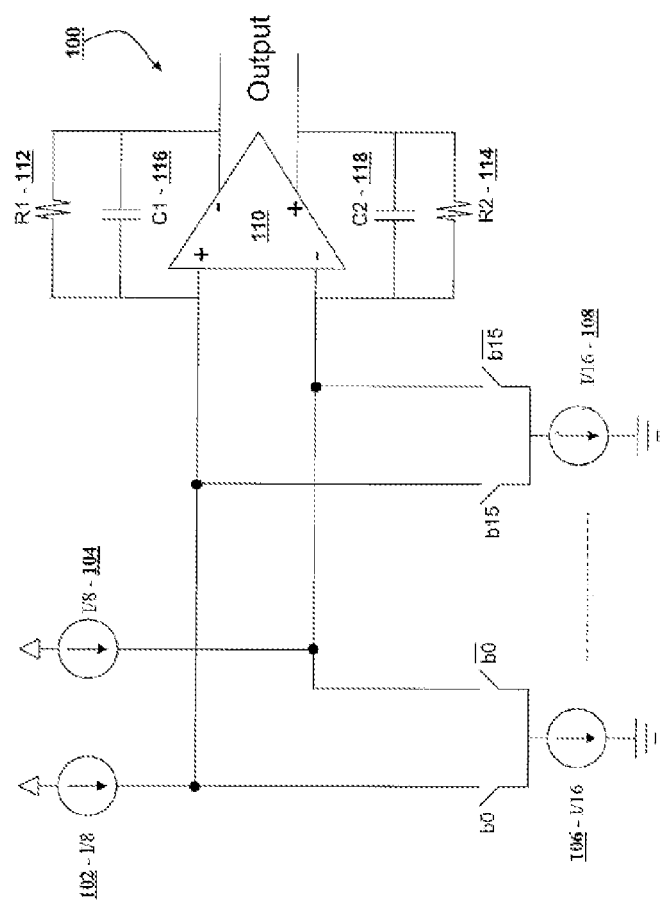
FIG. 1 illustrates a typical implementation of a 16-bit, two-level logic thermometer code current steering DAC.

A DAC is a device that produces a quantized (discrete step) analog output in response to a binary digital input code. The digital input may be e.g. input from transistor logic (TTL), emitter-coupled logic (ECL), complementary metal-oxide-semiconductor (CMOS) circuits, or low-voltage differential signaling (LVDS), while the analog output may be either a voltage or a current. To generate the output, a reference quantity (either a voltage or a current) is divided into binary and/or linear fractions. Then the digital input drives switches to the individual DAC cells of a DAC, which could comprise current sources, voltage sources, resistors, capacitors, etc. An output is produced by combining an appropriate number of these fractions, a process sometimes referred to as "encoding." The number and size of the fractions reflect the number of possible digital input codes, which is a function of converter resolution or the number of bits (N) in the digital input code. For example, N bits could result in $2^N$ possible codes.

In a DAC, a digital signal is provided to a coding element (encoder) which, in turn, switches the individual DAC cells on and off to convert digital input values of the digital signal to analog values. The number of DAC cells switched on at the same time represents an analog value of the resulting analog signal at that time.

For example, a DAC with 15 DAC units is capable of converting a 4-bit digital value (i.e., N=4) to one of 16 different analog values ($2^N$, so for N=4 the number of possible codes is $2^4$=16) by switching the appropriate DAC units on. For example, to convert a digital value 0110 to an analog value—six DAC units may be switched on, to convert a digital value 0111 to an analog value—seven DAC units may be switched on, to convert a digital value 1001 to an analog value—nine DAC units may be switched on, to convert a digital value 1011 to an analog value—eleven DAC units may be switched on, and so on.

DACs may be differentiated based on modulation schemes applied. Two modulation schemes often used to implement DACs are sigma-delta (sometimes also referred to as "delta-sigma") and Nyquist-rate (or simply "Nyquist").

DACs may also be differentiated based on circuit architecture used. Two circuit architectures often used to implement DACs are current steering DACs and switched capacitor DACs. "Current steering DACs" refer to DACs where current sources of the DAC cells are steered to generate an analog current output. "Switched capacitor DACs" refer to DACs where capacitors of the DAC cells are connected to different reference voltages to generate an analog voltage output.

Current steering DACs may be implemented as two-level or three-level DACs, described in greater detail below.

Two-Level Vs Three-Level Current Steering DACs

Current steering architecture is a commonly used approach in industry to realize DACs. Due to its simplicity and flexibility, this architecture is employed in a large combination of high speed or high resolution applications, often in context of sigma-delta DACs.

Current steering DACs may be implemented either as two-level DACs or three-level DACs. As known in the art, the term "two-level DAC" refers to a DAC comprising DAC cells that respond to 1 and 0 digital input values (i.e., two levels of digital input), while the term "three-level DAC" refers to a DAC comprising DAC cells that respond to +1, 0, and −1 digital input values (i.e., three levels of digital input).

FIG. 1 illustrates a typical implementation of a 16-bit thermometer-code two-level current steering DAC 100. The DAC consists of a bank of current steering cells 102, 104, 106, and 108, amplifier 110, a pair of feedback resistors 112 and 114, and in some cases a pair of capacitors, C1 116 and C2 118. Capacitors 116 and 118 effectively slow down the step output waveform to help reduce the amplifier slew rate requirement. The control bits and their complementary version are, in the simplest form, the Q and QB outputs of a D-flip flop array. The inputs of these D-flip flops are the digital DAC codes. The circuit operation is quite simple in that the digital codes control how many cells will be directed to the appropriate summing junction of the amplifier. A clock which defines the conversion rate of the DAC is used to synchronize all output transitions of the control bits via the D-flip flops.

Referring to FIG. 1 described above, one drawback of conventional thermometer-code current steering two-level DACs is thermal noise performance. In particular, when data is zero, half of the switching current sources may be connected to one summing junction, and the other half may be connected to the other summing junction of the I-to-V converter. Moreover, the top current sources may be always connected to the summing junctions. The current sources are the dominant thermal noise source in the DAC output and dictate the signal to noise ratio (SNR) of the converter.

Figure 2:
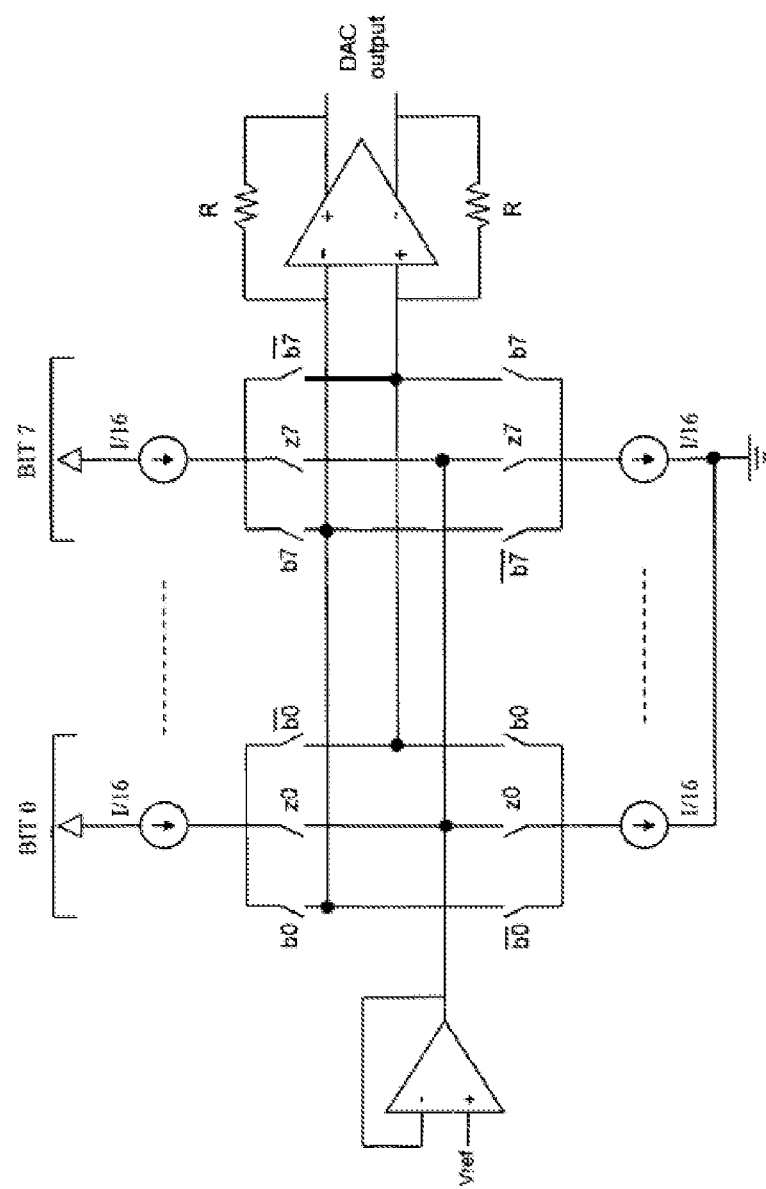
FIG. 2 illustrates a schematic diagram of an 8-bit, three-level logic thermometer code current steering DAC.

One technique previously used to overcome the above-discussed thermal noise problem is based on employing three-level logic thermometer current steering DAC cells, each including a pair of current sources (positive and negative) and 3 switches per each current source, the switches referred to herein as switches b, b_bar, and z. Such DAC cells are shown in the example of FIG. 2, illustrating eight three-level current steering DAC cells denoted as bits 0-7. Because, typically, A DAC employs multiple DAC cells, e.g. 16 DAC cells in the example of FIG. 1 or 8 DAC cells in the example of FIG. 2, the switches of a particular DAC cells are denoted in the FIGUREs with reference numbers indicating the DAC cell, e.g. a switch b of a DAC cell indicated as "cell 0" in FIG. 1 or of a DAC cell indicated as "bit 0" (the terms "bit" and "cell" being used interchangeably) in FIG. 2 is shown as a switch b0, a switch b of a DAC cell indicated as "cell 15" in FIG. 1 is shown as a switch b15, and so on.

For each three-level DAC cell (e.g. each of the bits 0-7 shown in FIG. 2), when a digital value of 1 is converted, switch b is closed while switches b_bar and z are open; when a digital value of −1 is converted, switch b_bar is closed while switches b and z are open; and, when a digital value of 0 is converted, switch z is closed while switches b and b_bar are open.

Since each pair of current sources may be connected to the summing junction in three different ways, each pair may contribute a positive quantity of charge, a negative quantity of charge, or nothing at all. When the data is zero, all the current sources are connected to a buffer amplifier to maintain their proper drain voltage. Thereby, the main noise source is from the amplifier, which by design is much smaller than that of the current sources. Hence, the SNR may be significantly improved, compared to the two-level current steering DACs.

Limitations on DAC Performance

Analog signals are continuous time-domain signals with infinite resolution and possibly infinite bandwidth. However, the DAC's output is a signal constructed from discrete values (quantization) generated at uniform, but finite, time intervals (sampling). In other words, the DAC output attempts to represent an analog signal with one that features finite resolution and bandwidth. Quantization and sampling impose fundamental, yet predictable, limits on DAC performance. Quantization determines the maximum dynamic range of the converter and results in quantization error or noise in the output. Sampling determines the maximum bandwidth of the DAC output signal according to Nyquist criteria. The Nyquist theory states that the signal frequency (that is, the DAC output) must be less than or equal to one-half the sampling frequency to prevent sampling images from occurring in the frequency band of the DAC output.

In addition, DAC operation is also affected by non-ideal effects beyond those dictated by quantization and sampling.

One such effect is component mismatch (i.e. mismatch between the DAC cells of a DAC) relating to variation in component values attributable to e.g. variations arising from the manufacturing process or thermal drift during operation of a device. Component mismatch leads to noise (mismatch errors), which may, in turn, lead to nonlinear behavior of DACs. Mismatch becomes especially pronounced for the most significant bit (MSB) components in case segmented DACs are used where the full resolution of the converter is spread across two or more sub-DACs, because unit values are larger there and generate more current or voltage at the output than the least significant bit (LSB) components.

Mismatch errors may be characterized by a number of static and dynamic performance specifications or parameters that determine converter's static and dynamic performance, such as e.g. spurious-free dynamic range (SFDR), representing the strength ratio of the fundamental signal to the strongest spurious signal in the output, and noise spectral density (NSD), representing the noise power per unit of bandwidth. These parameters are, therefore, important in choosing a suitable approach for mismatch compensation.

One approach for addressing component mismatch is to impose more stringent tolerances on manufacturing of components. However, this approach tends to decrease yield and therefore increases costs of unit components.

Other approaches include using one of dynamic element matching techniques, described in greater detail below.

Dynamic Element Matching (DEM)

DEM is a class of techniques used in integrated circuits (IC) design to compensate for the component mismatch. DEM techniques typically involve some kind of a dynamic process intended to reduce the effects of component mismatches in electronic circuits by dynamically re-arranging the interconnections of mismatched components so that the time averages of the equivalent components at each of the component positions are equal or nearly equal.

One DEM technique, conventionally referred to as "random scrambling DEM," is based on randomizing which DAC cells are turned on for converting each digital value. When random scrambling DEM is used, then, instead of switching consecutive DAC cells at each point in time (i.e. to convert each digital value), the same number of non-consecutive, randomly selected DAC cells are switched on. Other known DEM methods include e.g. Data Weighted Averaging (DWA) and its variations, vector feedback, and tree structure.

All of the known DEM techniques suffer from a drawback where the application of a DEM technique results in unpredictable and uncontrolled pseudo-periodic behavior of the analog output signal. This behavior manifests itself in appearance of tones, i.e. undesired artifacts appearing in the spectrum of an output signal which were not present in the input signal. In sigma-delta DAcs, these tones are referred to as "idle tones" and are one of the most commonly encountered effects of non-linearity. It would be desirable to improve on this issue.

Furthermore, since power consumption is an issue that engineers continuously try to improve on, it would be desirable to reduce power consumption of a DAC in context of application of various DEM techniques.

Improved Dynamic Element Matching

Embodiments of the present disclosure provide improved mechanisms for applying DEM techniques to a DAC comprising a plurality of DAC cells. Disclosed mechanisms include keeping track of the amplitude of the input digital signal over a certain period of time to determine the range of amplitudes of a portion of the input signal, and, when converting the digital values of that portion to analog values and applying a particular DEM technique, limiting the number of DAC cells on which a particular DEM technique is applied only to a number that is necessary for generating the analog output corresponding to the tracked portion, which number is determined based on the tracked amplitudes and could be smaller than the total number of DAC cells. In this manner, mismatch error may be reduced with smaller input signal amplitudes. Whenever possible, unused DAC cells may be put into a power saving mode, providing the advantage of reduced power consumption.

Conventional application of various DEM techniques fail to differentiate between different levels of input signal amplitudes. As a consequence, in conventional approaches, mismatch error is the same for input signals with relatively small amplitudes and for input signals with much larger amplitudes. In contrast, embodiments of the present disclosure are based on recognition that, with a smaller subset of DAC cells selected so that the minimum number of DAC cells necessary to correctly represent the input signal or a portion thereof is used, there is less mismatch error to begin with. Having a smaller mismatch error means that the idle tone problem or other undesirable consequences of mismatch between DAC cells are less pronounced or may even be sufficiently below the noise floor to be disregarded altogether. Furthermore, applying DEM techniques to a smaller subset of DAC cells reduces processing times and complexity.

Embodiments of the present disclosure are also based on the insight that the rest of the DAC cells, i.e. the DAC cells of the DAC not selected to be used for the conversion and application of DEM techniques for a portion of the input signal currently being processed, could be put into a power saving mode, e.g. be turned off. The latter may be particularly advantageous for three-level DACs because, in such DACs, unused DAC cells still consume relatively significant amount of power by having the z switch closed to represent a zero value and current flowing through the cells. Preventing the current from flowing through the unused DAC cells by turning such DAC cells completely off, e.g. by switching the current sources of those DAC cells off or/and opening all switches of such DAC cells so that the cells are not shunted, allows reducing power consumption of the DAC.

The improved DEM mechanisms will now be described with references to FIGS. 3-13.

Figure 3:
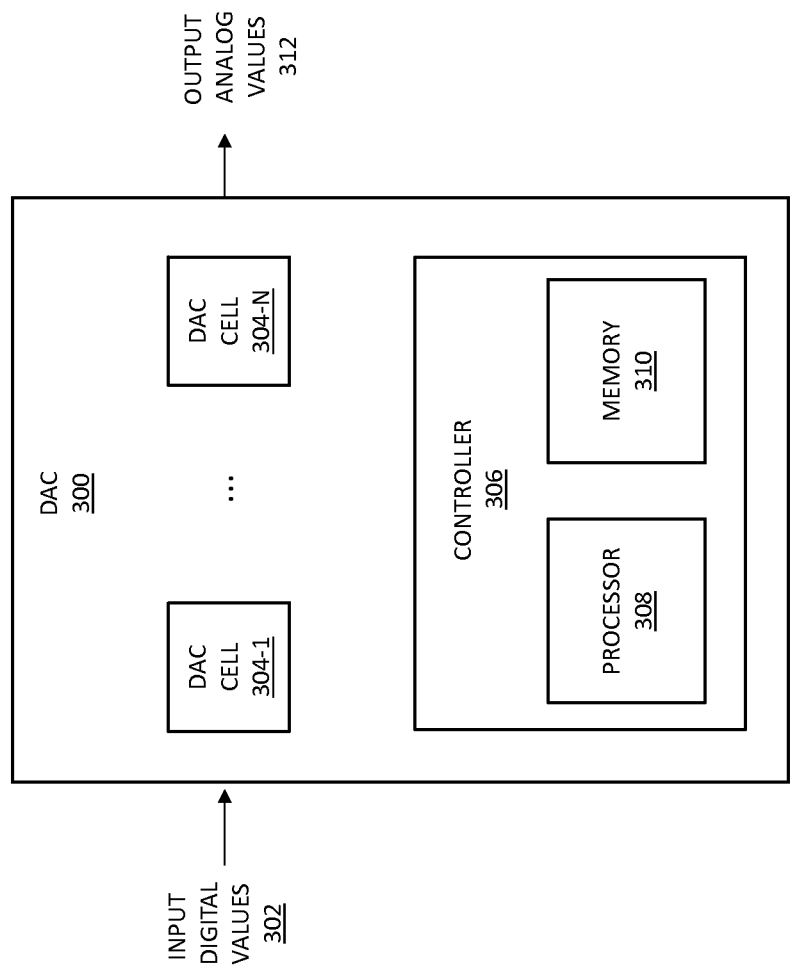
FIG. 3 illustrates a system view of an exemplary DAC configured to implement improved method for controlling the application of one or more DEM techniques, according to some embodiments of the disclosure.

FIG. 3 illustrates a system view of an exemplary DAC 300 configured to apply one or more DEM techniques, according to some embodiments of the disclosure. As shown in FIG. 3, the DAC 300 includes a plurality of DAC cells, indicated as DAC cells 304-1 through 304-N, where N is an integer greater than 1. The DAC 300 is configured to receive input digital values 302. The input digital values are provided to selected DAC cells for conversion to output analog values, shown in FIG. 3 as output values 312.

As also shown in FIG. 3, the DAC 300 may further include a controller 306 configured to implement improved methods for controlling the application of one or more DEM techniques as described herein. To that end, in some embodiments, the controller 306 may include at least a processor 308 and a memory 310 as shown in FIG. 3, configured to implement various methods for controlling the application of one or more DEM techniques as described herein.

In various embodiments, each DAC cell may be associated with a respective individual controller 306. In other embodiments, the controller 306 may be configured to control two or more, possibly all, DAC cells of a DAC. Furthermore, while FIG. 3 illustrates the controller 306 to be included within the DAC 300, in other embodiments, the controller 306 may be implemented external to the DAC 300, in which case the controller 306 may be configured to control the DAC 300 remotely, via any appropriate communication channel. In other words, instead of being implemented within the DAC 300 as shown in FIG. 3, the controller 306 may be external to the DAC 300 and be communicatively coupled to the DAC 300.

Figure 4:
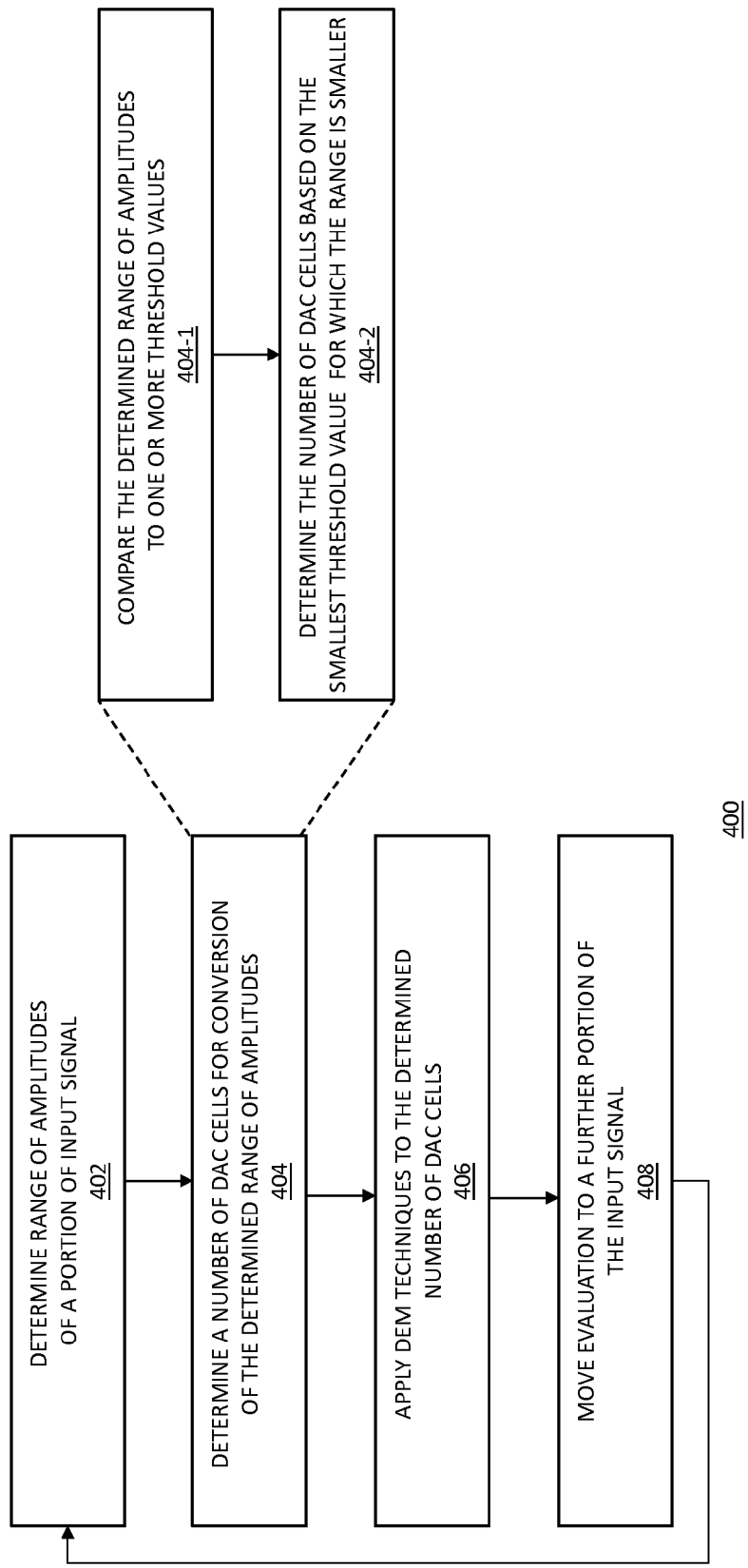
FIG. 4 illustrates a flow chart of a method for controlling application of one or more DEM techniques in a DAC comprising a plurality of DAC cells, according to some embodiments of the disclosure.

FIG. 4 illustrates a flow chart of a method 400 for controlling application of one or more DEM techniques in a DAC comprising a plurality of DAC cells, according to some embodiments of the disclosure. Although method 400 is now described with reference to elements illustrated in FIG. 3, any system or apparatus configured to perform steps of this method, in any order, is within the scope of the present disclosure.

As shown in FIG. 4 with box 402, the method 400 may begin with the controller 306 determining a range of amplitudes of a portion of the input signal 302 currently provided, or to be provided in the future, to the DAC 300. In some embodiments, the range of amplitudes may be determined by the controller 306 tracking the amplitude of the input signal, e.g. using a look-ahead functionality provided in another digital engine, e.g. in an interpolator, or by using an additional digital peak detector. A person of ordinary skill in the art would readily recognize various other methods for determining a range of amplitudes of a signal, all of which are within the scope of the present disclosure.

As shown in FIG. 4 with box 404, the controller 306 may then be configured to determine a number of DAC cells to be used for the conversion of the tracked portion of the input signal. Determination of a number of DAC cells to be used is made based on the range of amplitudes determined in box 402 by determining the number of DAC cells that may be necessary for generating the analog output corresponding to the evaluated portion of the input signal. In some optional embodiments illustrated in FIG. 4 with boxes 404-1 and 404-2, the determination may be made by comparing the determined range of amplitudes with one or more threshold values (box 404-1) and then determining the appropriate number of DAC cells to be used for the conversion of the digital input signal and the application of the DEM techniques based on the smallest threshold for which it was determined that the range of input amplitudes of box 402 is smaller (box 404-2).

Figure 5:
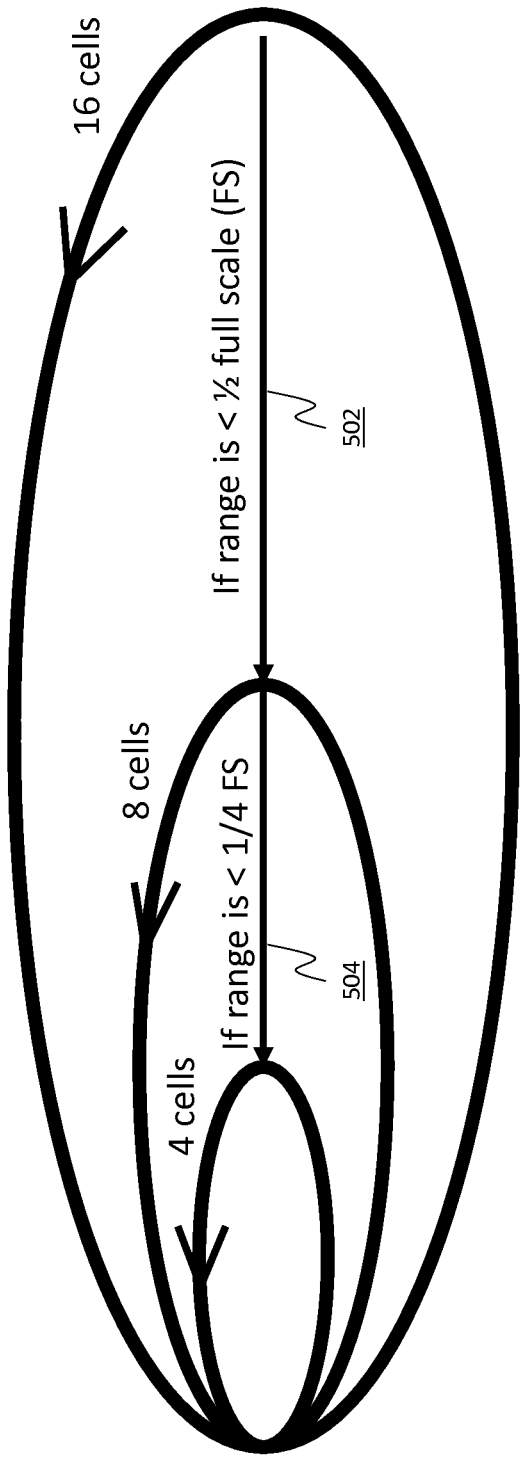
FIG. 5 illustrates a schematic diagram of "rotation rings" of applying DEM techniques to subsets of all DAC cells, according to some embodiments of the disclosure.

For an example of how the controller 306 may determine the number of DAC cells in box 404, consider an example of a 16 DAC cells of a thermometer-coded DAC, illustrated in FIG. 5. In such an example, 16 DAC cells can be used to convert a certain maximum range of amplitudes of input digital signals, referred to as a "full scale" (FS) of a DAC. In some embodiments, the controller 306 may be configured to compare the range of amplitudes of the portion of the input signal determined in box 402 to e.g. $\frac{1}{2}$ of the full scale of the DAC. The determined range being less than $\frac{1}{2}$ of the full scale of the DAC means that less than $\frac{1}{2}$ of all of the DAC cells of the DAC are necessary to represent the input digital values of that portion of the signal. In this case, the controller 306 may be configured to determine that the number of DAC cells that may be necessary for conversion is 8 (i.e., half of all of the DAC cells), as illustrated in FIG. 5 with an arrow 502 going from a full set of 16 DAC cells to a subset of 8 DAC cells.

Continuing with the example described above, the controller 306 may be configured to compare the range of amplitudes of the portion of the input signal determined in box 402 to multiple threshold values. For example, the controller 306 may compare the range also to e.g. $\frac{1}{4}$ of the full scale of the DAC. The determined range being less than $\frac{1}{4}$ of the full scale of the DAC means that less than $\frac{1}{4}$ of all of the DAC cells of the DAC are necessary to represent the input digital values of that portion of the signal. In this case, the controller 306 may be configured to determine that the number of DAC cells that may be necessary for conversion is 4 (i.e., quarter of all of the DAC cells), as illustrated in FIG. 5 with an arrow 504 going from a full set of 16 DAC cells, or from a subset of 8 DAC cells, to a subset of 4 DAC cells.

Comparing the range of amplitudes with multiple threshold values has the advantage of providing a finer level of granularity in adjusting the number of DAC cells to be used in application of DEM techniques. The controller 306 may be configured to optimize comparison of the determined range of input digital values in any manner that would be apparent to a person of ordinary skill in the art. For example, in some embodiments, the controller 306 may arrange the thresholds in the order from the smallest to the largest and then compare the determined range to the thresholds arranged in their order starting from the smallest threshold. In such embodiments, the controller 306 may be configured to only continue to the next threshold if it is determined that the determined range is not smaller than the current threshold.

For example, consider that the determined range is about $\frac{3}{16}$ of the full scale of a 16-cell DAC and there are three threshold levels: $\frac{1}{8}$, $\frac{1}{4}$, and $\frac{1}{2}$ of the full scale. The controller 306 would then first compare the determined range to $\frac{1}{8}$ of the full scale (i.e., the smallest threshold), determine that the range is not smaller than that threshold, and then continue to the next threshold. The next threshold is $\frac{1}{4}$. The controller 306 would determine that the range is smaller than that threshold and, therefore, would establish that the number of DAC cells to use for the conversion of the input signal and the application of DEM techniques is the number corresponding to that threshold, i.e. 4 cells. The controller 306 does not have to compare the determined range to higher thresholds, i.e. in this example the controller does not have to compare the determined range to the last threshold of $\frac{1}{2}$ because the determined range is already established to be smaller than $\frac{1}{4}$.

Returning back to FIG. 4, the method may then proceed to box 406, where the controller 306 ensures that application of whatever DEM technique may be used to compensate or reduce the mismatch between different DAC cells of the DAC 300 is limited to the number of DAC cells determined in box 404. In a simple example, consider that the random scrambling DEM technique is used on a thermometer coded DAC with 16 DAC cells, the largest amplitude of a portion of the input digital signal being evaluated is $\frac{3}{8}$ of the full scale of the DAC, and the smallest threshold for which the controller determined that the range is smaller than the threshold is $\frac{1}{2}$ of the full scale. In this case, $\frac{1}{2}$ of all of the DAC cells would be sufficient to represent any amplitude within this range, since the largest amplitude is $\frac{3}{8}$ of the full scale. The controller may then select which half of the DAC cells are to be used, limit conversion of this portion of the input signals to selected half of all of the DAC cells and only apply the random scrambling DEM technique to those half of the cells.

It should be noted that, in various embodiments, various manners for selecting the DAC cells could be used. In some embodiments, the DAC cells used could comprise consecutive DAC cells. For a DAC with 16 cells in the example above, this may e.g. mean using DAC cells 0-7, DAC cells 3-10 or any other 8 consecutive DAC cells, for the conversion of the digital signal and application of DEM techniques. In other embodiments, the selected subset of DAC cells may include non-consecutive DAC cells, e.g. DAC cells 0, 3, 4-6, 11, 13, and 15.

In any of the embodiments described herein, adaptively changing the size of a group of DAC cells used in a particular DEM technique according to the envelope of input signal amplitude by switching over to a subset of DAC cells comprising a smaller number of DAC cells than all DAC cells of a DAC when the envelope of at least a portion of the input digital signal allows it (i.e. when the range of the amplitudes of the portion of the input signal is such that the digital input signal may be correctly represented by the subset of the DAC cells), reduces the mismatch error that needs to be dealt with, resulting in reduced shaped mismatch error. Dynamics of application of a particular DEM technique then become more effective. In fact, simulations illustrate that using this method results in first order DEM techniques outperforming higher-order DEM techniques.

When/if possible, DAC cells not selected to be in the subset of DAC cells used for the conversion and application of the DEM techniques may be put in some kind of power saving mode, thus allowing to reduce power consumption of a DAC. For example, in case of three-level DACs, DAC cells not selected to be in the subset of DAC cells used for the conversion and application of the DEM techniques may be completely turned off to save power. Since the input frequency is typically slow, the unused DAC cells will typically be turned off and stay off for long periods of time, depending on the signal envelope.

In some embodiments, the evaluation of a portion of the input signal and adjusting the number of DAC cells as illustrated with boxes 402-406 is performed multiple times, e.g. continuously or at certain points in time, evaluating different portions of the input signal. For example, a portion of the input signal being evaluated may be viewed as a sliding window, sliding forward in time as the input signal is being converted. In such embodiments, the method of FIG. 4 may then proceed to box 408 where evaluation is moved to a further portion of the input signal, after which actions of boxes 402-406 are repeated for the further portion.

In other embodiments, the entire input signal may be evaluated at once, which may be particularly advantageous e.g. when the controller 306 is provided with the maximum amplitude of the input signal for all amplitudes of the input signal, where steps 402-406 are performed just once, for the entire signal.

In the embodiments where the input signal is evaluated portion by portion, it may happen that, once the application of DEM techniques has been limited to a subset of DAC cells, the amplitude range of a subsequent portion of the input signal is such that all DAC cells need to be used for the conversion. In this case, the controller 306 may be configured to switch back to using all DAC cells for the conversion and the application of the DEM techniques. In particular, in this case, the controller 306 would determine in box 404 that the number of DAC cells for conversion of that portion of the input signal is all DAC cells of a DAC.

Role of Cumulative Error in Deciding when to Switch to a Subset of DAC Cells

In some embodiments, the controller 306 may be configured to not only determine a number of DAC cells to use for the conversion and limit application of DEM techniques to a selected subset of DAC cells, but also to determine the timing of when a switch from some other number of DAC cells (e.g. all DAC cells) to the selected subset of DAC cells should occur. Once a suitable time for making the switch has been identified, the controller 306 may then be configured to ensure that the switch is made at that time.

In such embodiments, the suitable time for making the switch may be determined by evaluating a cumulative error due to mismatch of the plurality of DAC cells being used, e.g. by the controller 306 determining, either continuously or at certain times, whether the cumulative error satisfied one or more criteria. Preferably, the controller 306 would ensure that a switch to using a different number of DAC cells as determined in box 404 would take place when the cumulative error is equal to zero, or at least is within a certain, typically relatively small, range from zero, in order to not interfere with the DEM activities applied. As used herein and as is known in the art, the term "cumulative error" refers to an integral of a static mismatch error introduced at every clock cycle over time, i.e. a summation of all static mismatch errors at every clock cycle for a duration of a certain time period. As is known to a person of ordinary skill in the art, cumulative error may be defined on a per-DAC cell basis or for the entire DAC comprising a plurality of DAC cells. A person of ordinary skill in the art would also know how to determine when a cumulative error is equal to zero, which determination would depend on the nature of the DAC and the DEM algorithm being implemented. However, a few illustrative examples are described below.

Example of Determining that Cumulative Error is Equal to Zero in Three-Level DACs In some embodiments, the DAC 300 may comprise a sigma-delta DAC that may include a signed thermometer encoder for encoding signed binary data into signed thermometer data and a rotational dynamic element matching (DEM) logic for outputting shuffled signed thermometer data (not specifically shown in FIG. 3). According to one example embodiment of the present disclosure, the rotational DEM logic may further include a DEM decision logic that may convert signed binary data input into positive and/or negative pointer data, a barrel shifter for shifting positive thermometer data input based on the positive pointer data, and a barrel shifter for shifting negative thermometer data input based on the negative pointer data.

Figure 6:
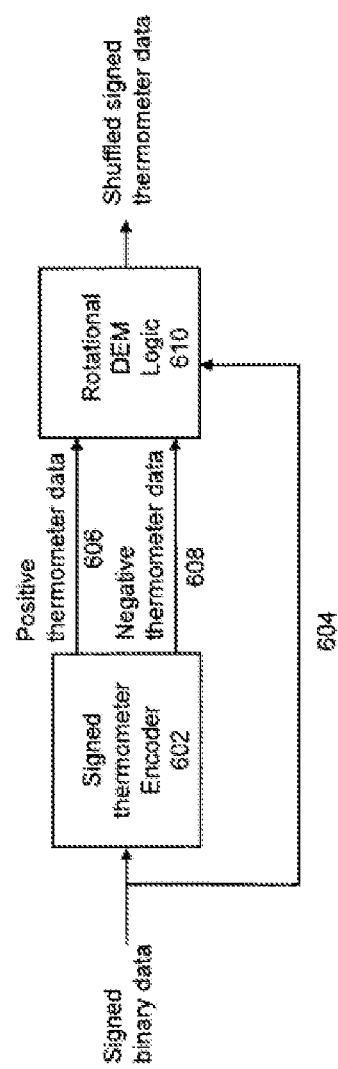
FIG. 6 illustrates a systematic diagram of a shuffler using a rotational DEM logic for shuffling signed thermometer data, according to some embodiments of the disclosure.

FIG. 6 shows a systematic diagram of a shuffler using a rotational DEM logic for shuffling signed thermometer data according to some embodiments of the present disclosure. In a multi-bit, three-level logic sigma-delta DAC, the digital input may include signed binary data. In one example embodiment of the present disclosure, the signed binary data input, e.g., N bit binary data, may be encoded at a signed thermometer encoder 602 into $2^N$ levels of thermometer data. The signed thermometer encoder 603 may encode positive binary data input into positive thermometer data and negative binary data input into negative thermometer data. The signed thermometer data and the signed binary data may be both fed to a rotational DEM functional unit (see details in the following FIG. 7) for producing an output of shuffled signed thermometer data.

According to one example embodiment of the present disclosure, the signed thermometer data streams may be first paired up so that each pair can take the value of (+1, 0, or −1). The pairs of data may then be passed through two barrel shifters controlled by a DEM logic block 610 where one barrel represents positive data, and one barrel represents negative data. The input of the DEM block may include the signed binary data. The output of the DEM logic block may include two pointers, —one for positive data and one for negative data, —called positive pointer and negative pointer for convenience—, which indicate the current location of the sequence of elements to be used as output.

Figure 7:
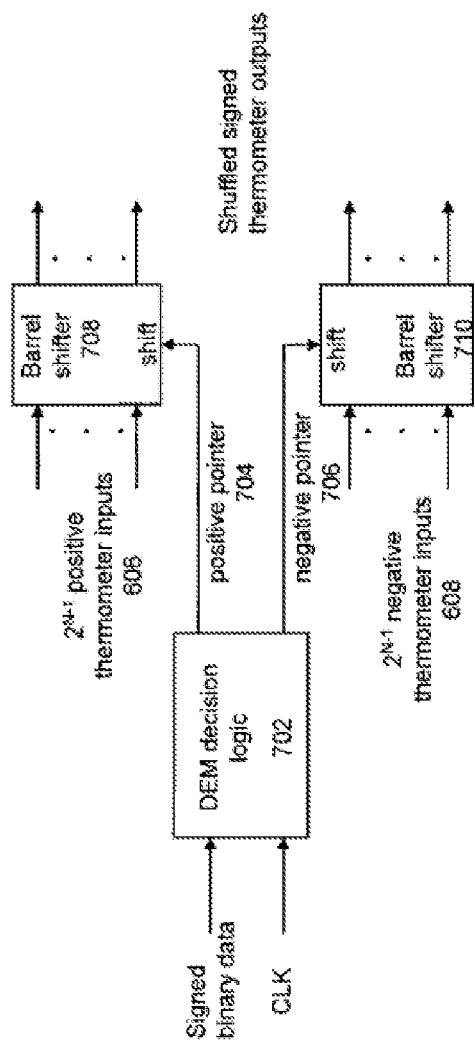
FIG. 7 illustrates a detailed systematic diagram of the rotational DEM logic as shown in FIG. 6 for shuffling signed thermometer data using two barrels of shifter, according to some embodiments of the disclosure.

FIG. 7 shows a detailed systematic diagram of the rotational DEM logic as shown in FIG. 6 for shuffling signed thermometer data using two barrels of shifter according to one example embodiment of the present disclosure. The rotational DEM logic 610 as shown in FIG. 6 may include a DEM decision logic 702 and two barrel shifters 708, 710. The DEM decision logic 702 may take input of signed binary data and generate a first pointer for positive data (called positive pointer 704 for convenience) and a second pointer for negative data (called negative pointer 706 for convenience). Although FIG. 7 illustrates barrel shifters 708, 710, other circular shift registers can find application in this design. Therefore, the barrel shifter 708 for positive thermometer input may be, e.g., a one byte register with a shift that controls a positive pointer pointing to a starting position of positive data, and the barrel shifter 706 for negative thermometer input may also be, e.g., a one byte register with a shift that controls a negative pointer pointing to a starting position of negative data.

When the signed binary data is positive, only the positive pointer may be updated based on the positive signed binary data. On the other hand, when the signed binary data is negative, only the negative pointer may be updated based on the negative signed binary data. The mismatch error of an element $u_i$ of a shuffler may be defined as the difference between the actual value of the element and the average value of all the elements. Specifically, for an N-element thermometer DAC, the error of element $u_i$ may be formulated as:

$$e_i = u_i - \frac{1}{N}\sum_{k=0}^{N-1} u_k$$

As such, each time when the data is "+1" and the element ui is selected, the error contributed to the output is $+e_i$. Each time when the data is "−1" and the element ui is selected, the error contributed to the output is $-e_i$. When the data is zero, the error contributed by element $u_i$ during that particular clock cycle is zero.

Figure 8:
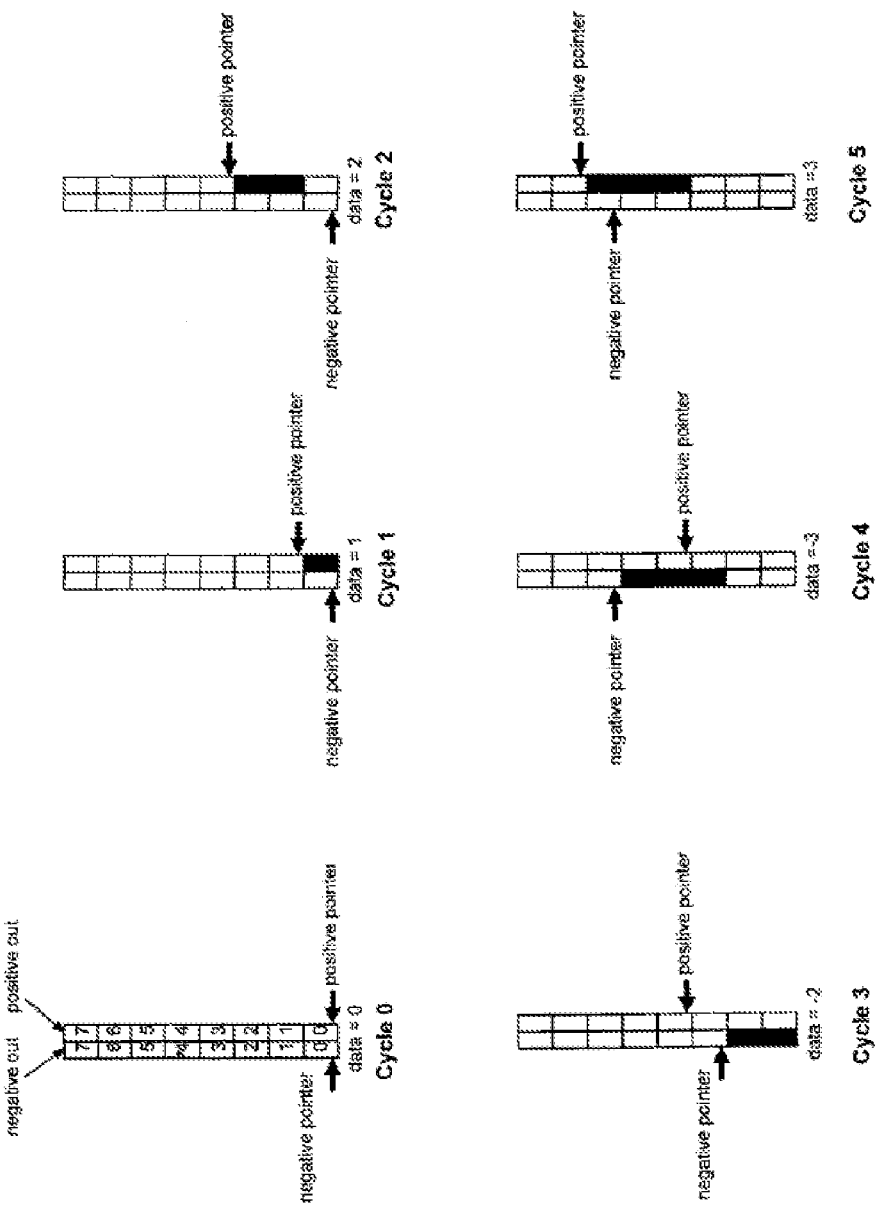
FIG. 8 illustrates exemplary operations of eight-element, three-level rotational DEM logic shufflers using two barrels of shifter, according to some embodiments of the disclosure.
Figure 8:
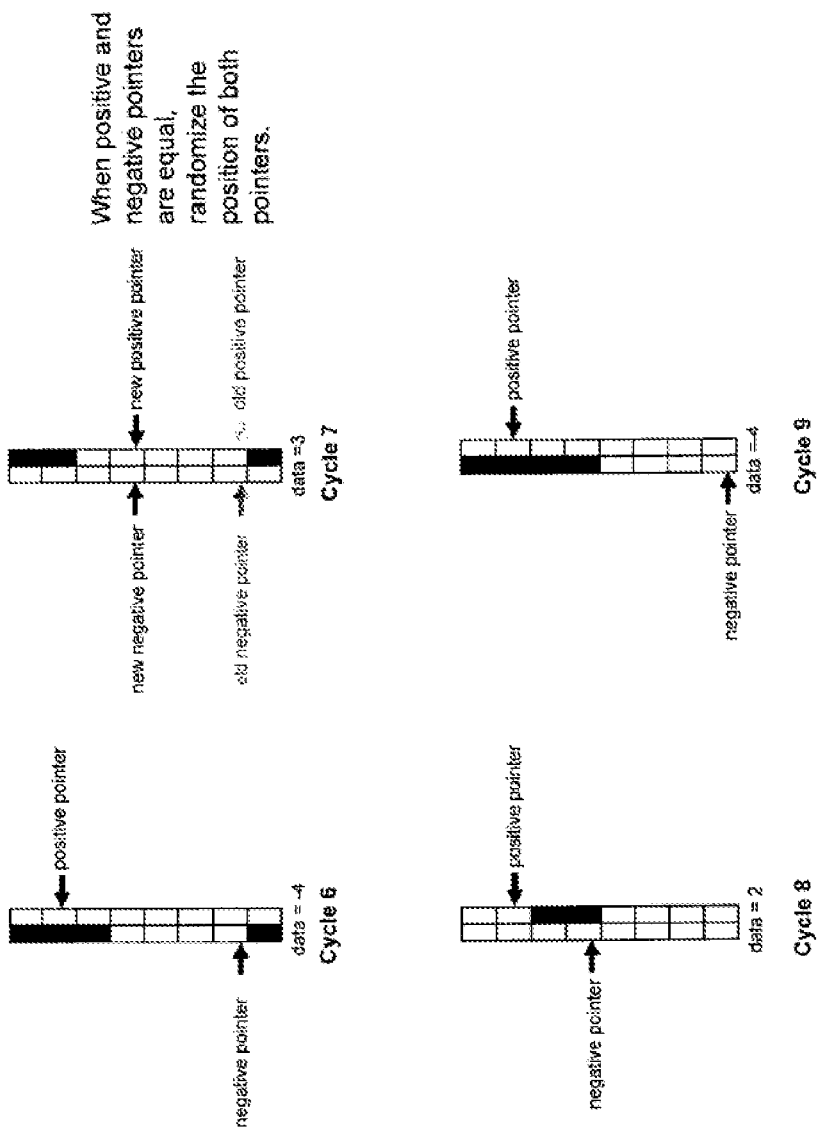

FIG. 8 illustrates exemplary operations of eight-element, three-level rotational DEM logic shufflers using two barrels of shifter according to one example embodiment of the present disclosure. In this example embodiment, a first shifter of 8 bit long may be used for positive thermometer magnitude data. A second shifter of 8 bit long may be used for negative thermometer magnitude data. The first and second shifters may be paired up with a positive pointer pointing to the position where to place next positive thermometer data and a negative pointer pointing to the position where to place next negative thermometer data. The initial positions of the positive and negative pointers may start, e.g., at position 0.

For an example input data sequence of (0, 1, 2, −2, −3, 3, −4, 3, 2, −4), each input data value represents a data value at a clock cycle. At cycle 0, both the positive and negative pointers are at position 0 for the input value is 0. At cycle 1, the positive pointer may move from position 0 to position 1 for the input value 1, while the positive element 0 is activated. At cycle 2, the positive pointer may move from position 1 to position 3 for the input value 2, while the positive elements 1 and 2 are activated. At cycle 3, the negative pointer may move from position 0 to position 2 for the input value 2, while the negative elements 0 and 1 are activated. At cycle 4, the negative pointer may move from position 2 to position 5 for the input value −3, while the negative elements 2 to 4 are activated. At cycle 5, the positive pointer may move from position 3 to position 6 for the input value 3, while the positive elements 3 to 5 are activated. At cycle 6, the negative pointer may move from position 5 to position 1 after a wrap around for the input value −4, while the negative elements 5 to 7 and 1 are activated.

At this point, it may be observed that since the positive and negative pointers advance and wrap around, all element within a barrel are used approximately equally for a long sequence of input values. Hence, the long term average error contributed by each element may approach zero. Assuming input symbols are randomly distributed in the sigma-delta modulated way, when both pointers are at an equal position, e.g., at position 1 at cycle 7, two observations may be made. First, all elements within a barrel of shifter would have been used equally among them. Second, the cumulative error contributed by each element would approach zero.

For a DAC implementing DEM technique utilizing positive and negative pointers as described above, the controller 306 could be configured to determine that the cumulative error is zero when a starting position of next positive thermometer data is the same as a starting position of next negative thermometer data. In other words, the controller 306 could be configured to determine that the cumulative error is zero when a first pointer indicating a starting position of next positive thermometer data overlaps, or is equal to, or points to the same position as, a second pointer indicating a starting position of next negative thermometer data.

An exemplary algorithm that the controller 306 may be configured to carry out to switch to smaller groups of DAC cells when the input signal decreases is illustrated below for the example of DEM rotation rings shown in FIG. 5 (conventional programming nomenclature is used):

```
If (peak detector <= ¼ full scale input) {
    If(the positive_pointer = = negative_pointers) {// safe switch over point
        If (¼ full scale - current_input) <= 1 {// safety check
            // Reset both pointer to 0, ring size is now ¼ of full ring length
            // Set the dither to be ¼ of the full ring size
            ring_size = ¼;
            positive_pointer = 0;
            negative_point = 0;
        }
    }
}
Else If (peak detector <= 1/2 full scale input) {
    If(the positive_pointer = = negative_pointers) {// safe switch over point
        If (½ full scale - current_input) <= 1 {//Safety check
            // Reset both pointer to 0, ring size is now ½ of full ring length
            // Set the dither to be ½ of the full ring size
            ring_size = ½
            positive_pointer = 0;
            negative_point = 0;
        }
    }
}
Else {ring_size = 1;}// The DEM is working on full size ring
```

An exemplary algorithm that the controller 306 may be configured to carry out to switch back to the to larger group of DAC cells when the input signal increases is illustrated below for the example of DEM rotation rings shown in FIG. 5 (again, conventional programming nomenclature is used):

If (½ full scale>peak_detector) && (peak_detector>=¼ full scale)
   {ring_size=½ full scale;}
Else if(peak_detector>=½ full scale)
   {ring_size=1;}

Based on the descriptions provided herein, a person of ordinary skill in the art would readily recognize how to configure a controller to determine when the cumulative error for three-level DACs employing DEM techniques other than the DEM technique employing positive and negative pointers described above, such as e.g. a DEM technique based on butterfly Fast Fourier Transforms or a DEM technique based on vector quantization. Therefore, all of the various methods of determining when a cumulative error is equal to zero or within a certain range from zero for three-level DACs is within the scope of the present disclosure.

Example of Determining that Cumulative Error is Equal to Zero in Two-Level DACs

For two-level DACs, DEM techniques using pointers are also known. In particular, some DEM techniques use the concepts of "current pointer" and "reference pointer." In this context, again, a pointer refers to a particular DAC cell. A reference pointer is a predefined DAC cell from which application of a DEM technique starts, e.g. DAC cell 0. A current pointer is a DAC cell in different cycles of DEM. Typically, when such a DEM starts, current pointer is equal to the reference pointer. Then, over the course of execution of different cycles of DEM, current pointer switches to other DAC cells. At some point, the current pointer may again become equal to the reference pointer. This is the time when the cumulative error is zero and this would be the optimum time for switching over to application of the next round of DEM cycles on a subset of DAC cells as defined in box 404 above. Thus, in some embodiments employing two-level DACs, the controller 306 could be configured to determine that the cumulative error is zero when a current pointer indicating a starting position of applying the one or more DEM techniques overlaps, or is equal to, or points to the same position as, a predefined reference pointer.

Based on the descriptions provided herein, a person of ordinary skill in the art would readily recognize how to configure a controller to determine when the cumulative error for two-level DACs employing DEM techniques other than the DEM technique employing current and reference pointers described above. Therefore, all of the various methods of determining when a cumulative error is equal to zero or within a certain range from zero for two-level DACs is within the scope of the present disclosure.

Simulation Results

FIGS. 9-12 illustrate simulations for a DAC including 32 DAC cells, without and with application of variable length DEM as described herein. Because these FIGURES refer to Fast Fourier Transforms, first, a brief description of these transforms is provided.

Behavior of signals can be analyzed in the time domain (e.g., how the signal amplitude varies over time) as well as the frequency domain (i.e., the different frequency components that make up the signal), where the Fourier transform mathematically relates these two domains. In addition, a signal can be analyzed as a continuous waveform or, in digital-signal processing (DSP) applications, as a large set of time-domain points. Fast Fourier Transforms (FFTs) refer to algorithms for calculating discrete Fourier transforms (DFTs), as well as their inverses (IDFTs), of signals represented in digital form. Because of the ubiquitous use of Fourier transforms across signal-processing applications, many different FFT algorithms exist, such as e.g. decimation in time, decimation in frequency, radix-r, radix-4, mixed radix, etc. As a result of applying a FFT to a signal, a frequency decomposition of a portion of the signal is obtained. The frequency decomposition may be arranged in an array where frequencies are indexed, e.g. frequencies may be described as indexed by "f". Each element of such an array, indexed by (f) comprises a value resulting from the application of the transformation function. The values may be complex values or a positive real quantities X(f) of the complex values, such quantities representing magnitudes of e.g. signal acquired by a receiver, presented e.g. as an actual magnitude, a squared magnitude, or as a compressive transformation of a magnitude, such as a square root. Each element of such an array is commonly referred to as a "frequency bin" or simply a "bin," the term "bin" representing the fact that such an array may be considered as comprising a plurality of "containers" into which the signal's energy is distributed. Frequency bins often come into play in context of FFT algorithms employed by e.g. radar and sonar receivers in that separation of a particular radar or sonar signal of interest (i.e. a radar or sonar signal generated by a particular source of interest) from the total signal acquired by a radar or a sonar sensor may be achieved by identifying which bin(s) correspond to the signal of interest, i.e. at which frequencies the signal of interest is active.

Figure 9:
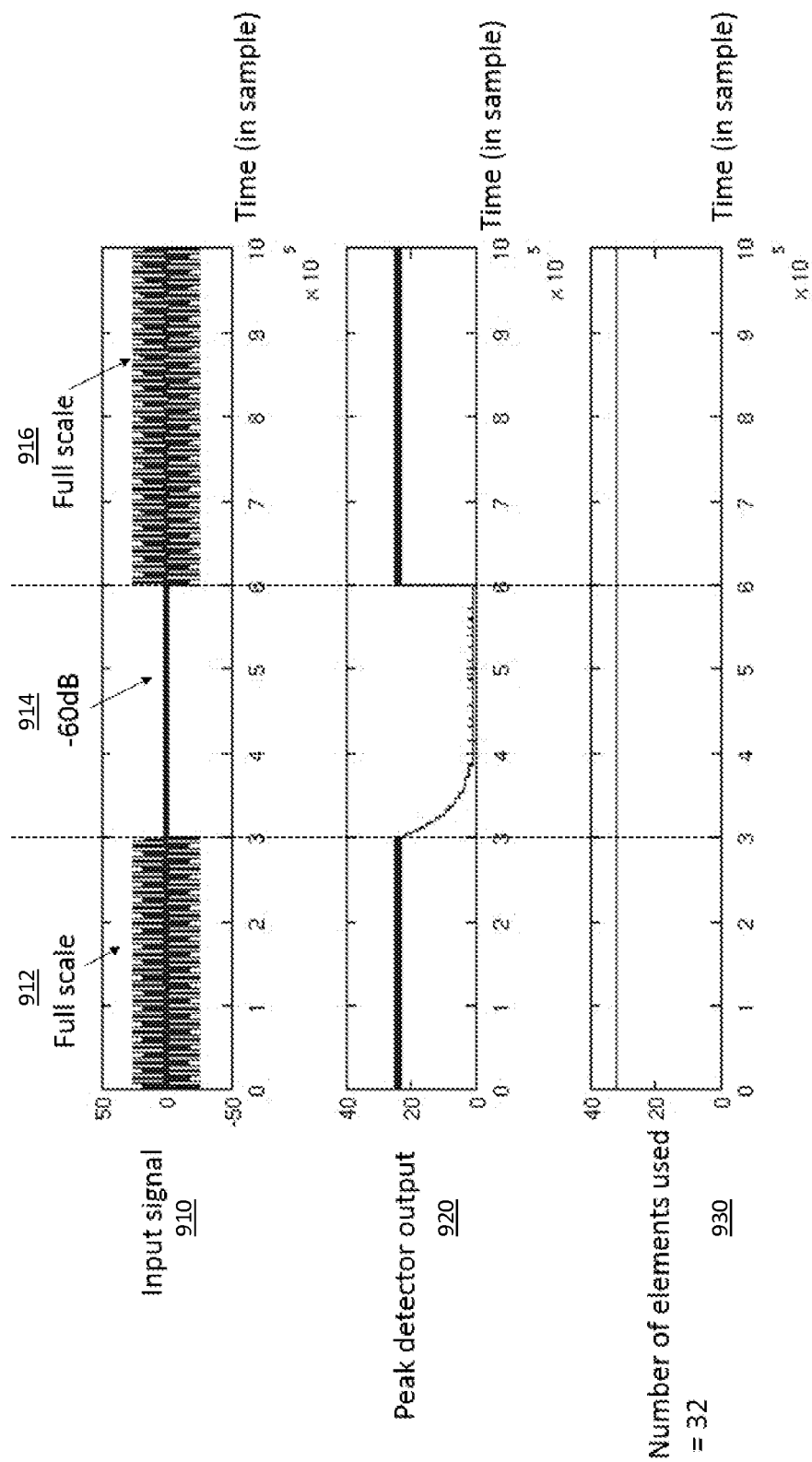
FIG. 9 illustrates simulation of an exemplary scenario of an input signal with varying amplitude and application of a DEM technique on a constant number of DAC cells.

Turning now to FIGS. 9-12, FIG. 9 illustrates input signal 910, peak detector output 920, and number of DAC cells used 930 for a scenario when improved mechanisms for application of DEM techniques as described herein is not used. This can be seen in FIG. 9 with the number of DAC cells being the same, 32 DAC cells, even when the input signal drops from full scale at portion 912 to −60 dB at portion 914. The number of DAC cells remains the same at portion 916, where the input signal returns to full scale again. Boundaries between portions 912, 914, and 916 are shown in FIG. 9 with vertical dashed lines.

Figure 10:
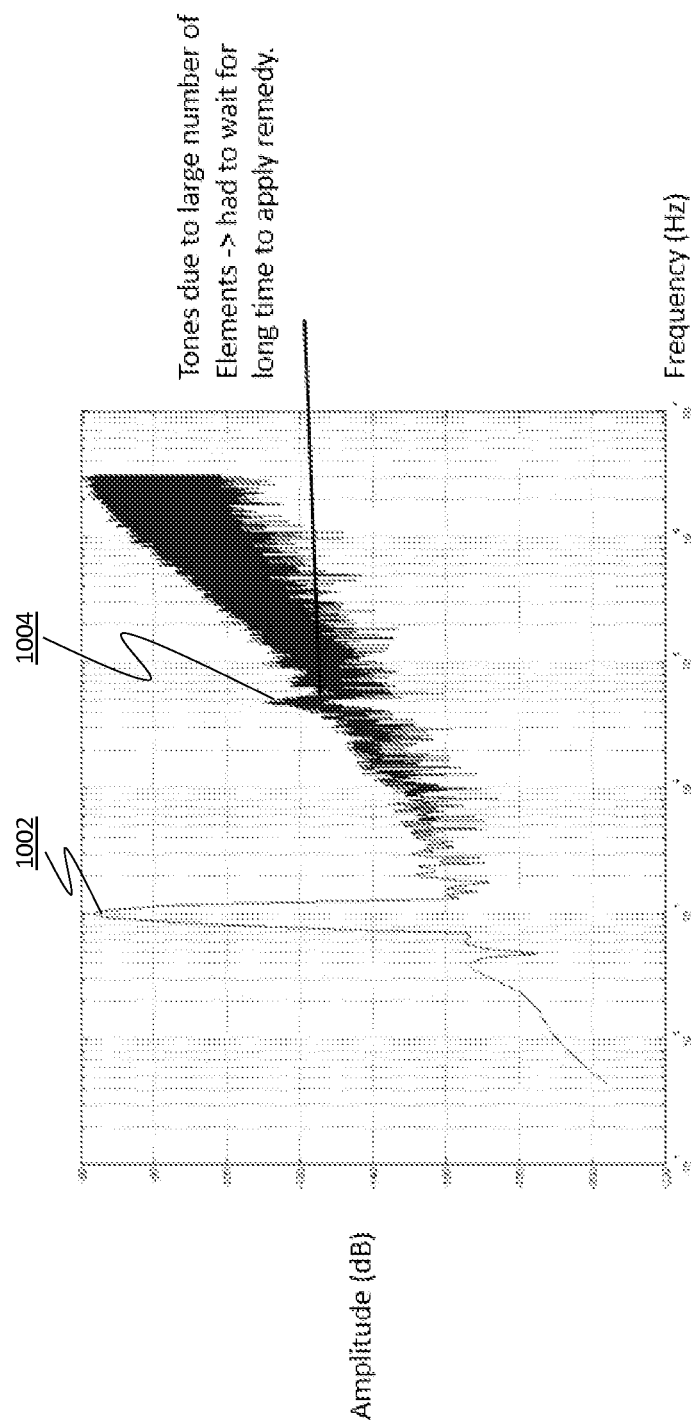
FIG. 10 illustrates simulation applying a Fast Fourier Transform to a low-amplitude portion of the input signal in the exemplary scenario of FIG. 9.

FIG. 10 illustrates a Fast Fourier Transform 1000 for the small input signal magnitude portion of the input signal illustrated in FIG. 9, i.e., the −60 dB portion 914.

As can be seen in FIG. 10, besides the correct peak 1002 corresponding to the signal of interest, the FFT 1000 contains idle tones—an undesired peak 1004, due to the large number of DAC cells because it took a while to apply the DEM to 32 DAC cells.

Figure 11:
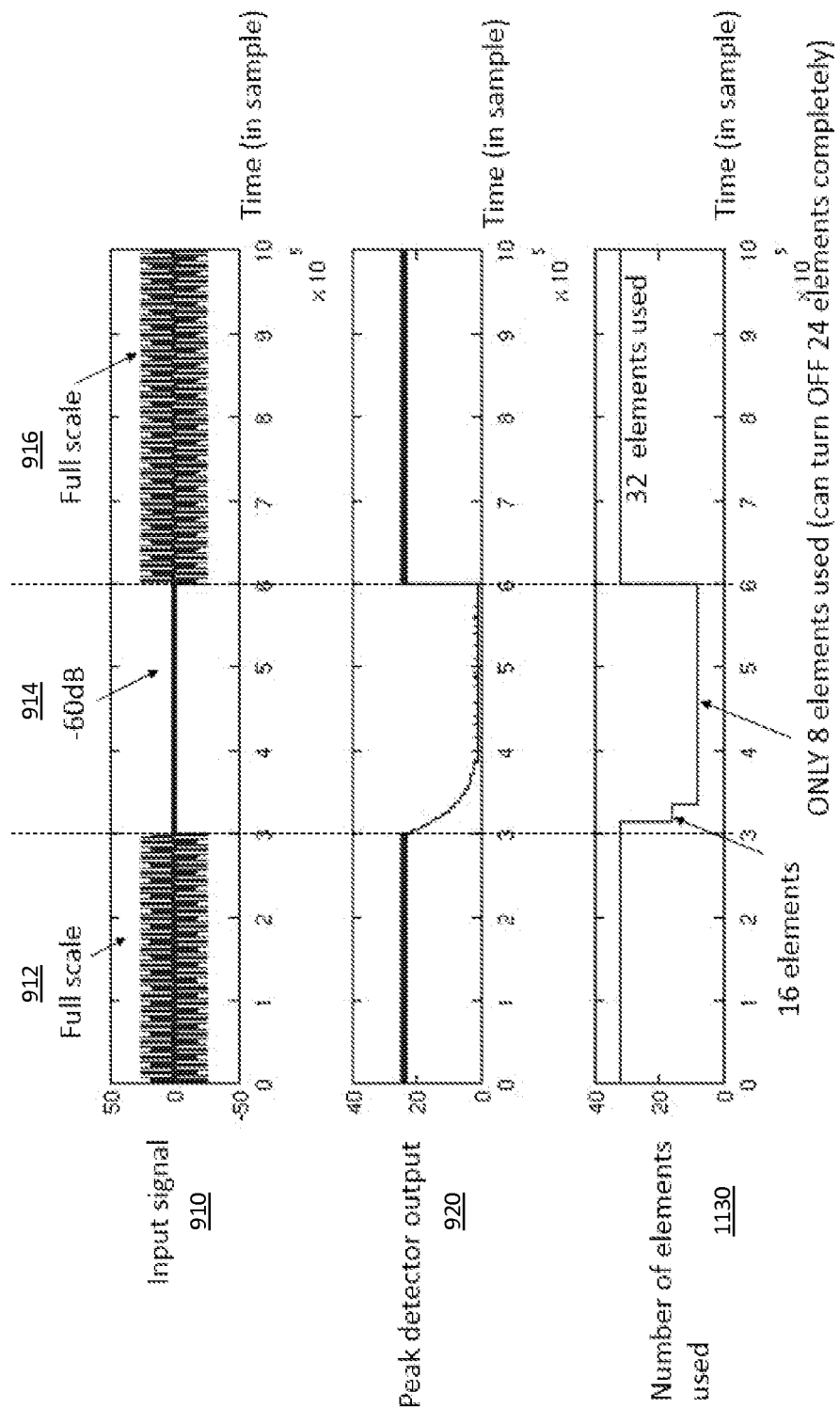
FIG. 11 illustrates simulation of an exemplary scenario of an input signal with varying amplitude and application of a DEM technique on a varying number of DAC cells, according to some embodiments of the disclosure.

FIG. 11 illustrates the same input signal 910 and the peak detector output 920 as shown in FIG. 9. In contrast to the simulation of FIG. 9, FIG. 11 illustrates an example where improved mechanisms for application of DEM techniques as described herein are used. This is shown with changing numbers of DAC cells 1130 used. Portions 912, 914, and 916 shown in FIG. 9 are the same in FIG. 11. As shown in FIG. 11, application of the improved mechanisms for limiting the DEM techniques to smaller group(s) of DAC cells when input signal amplitude is small results in that, when the input signal amplitude decreases to −60 dB in the portion 914 and the peak detector output 920 indicates that, the controller 306 selects lesser numbers of DAC cells to be used—in the example of FIG. 11 it is shown that, at the beginning of the portion 914, 16 DAC cells of 32 DAC cells in total are used, and, later in the portion 914, only 8 DAC cells are used. For the latter case of using only 8 DAC cells, this means that as many as 24 DAC cells may be turned off, providing substantial power savings.

Figure 12:
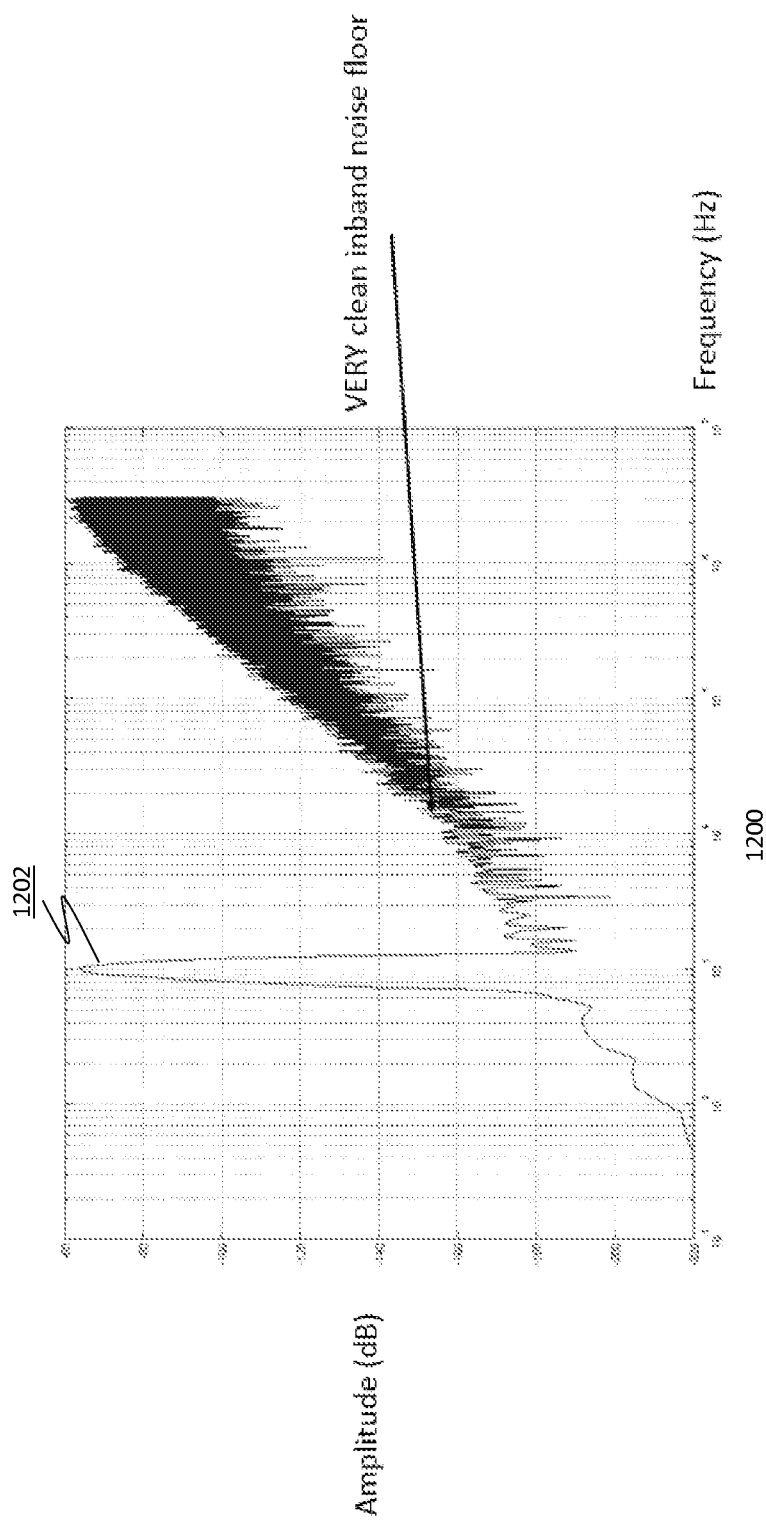
FIG. 12 illustrates simulation applying a Fast Fourier Transform to a low-amplitude portion of the input signal in the exemplary scenario of FIG. 11, according to some embodiments of the disclosure.

FIG. 12 illustrates a Fast Fourier Transform 1200 for the small input signal magnitude portion of the input signal illustrated in FIG. 12, i.e., the −60 dB portion 914, when variable DEM mechanisms described herein are applied. As can be seen in FIG. 12, besides the correct peak 1202 corresponding to the signal of interest, in contrast to the FFT 1000 for the same portion of the same input signal, the FFT 1200 does not contain idle tones, but, rather, shows a very clean in-band noise floor. FIG. 12 illustrates that implementation of mechanisms related to application of DEM techniques as described herein may allow achieving the minimum shaped mismatch error in-band and increase the effectiveness of idle tone remedies.

Exemplary Data Processing System

Figure 13:
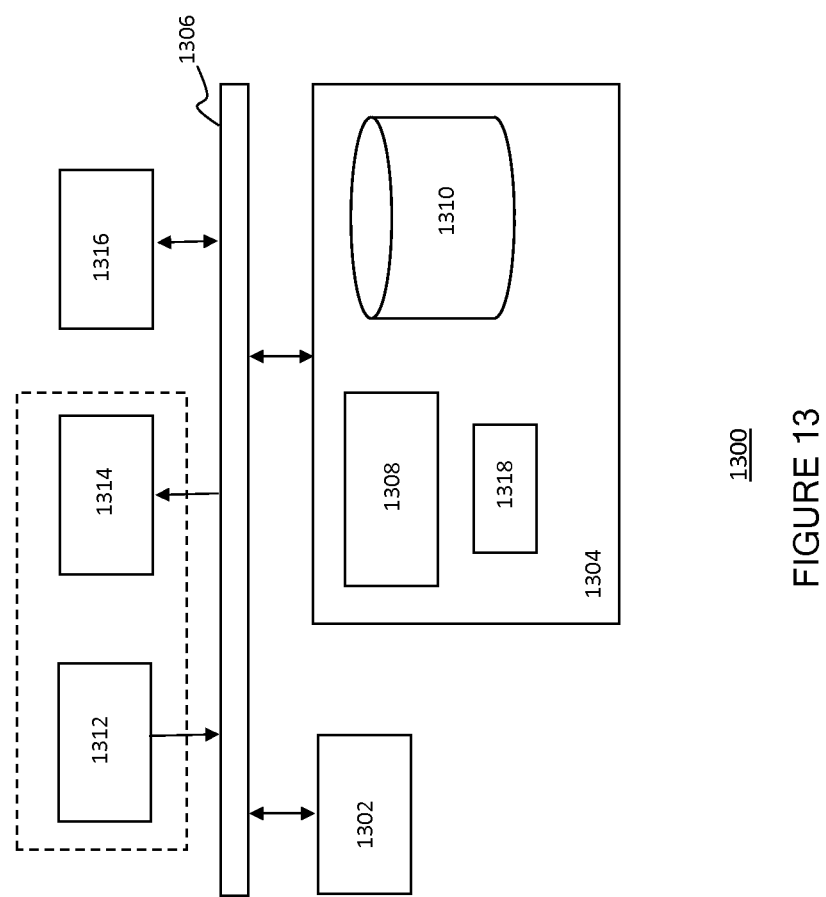
FIG. 13 depicts a block diagram illustrating an exemplary data processing system, according to some embodiments of the disclosure.

FIG. 13 depicts a block diagram illustrating an exemplary data processing system 1300, according to one embodiment of the present disclosure. Such a data processing system could be configured to e.g. function as the controller 306 described herein or as any other system configured to implement various improved mechanisms related to controlling application of DEM techniques as described herein.

As shown in FIG. 13, the data processing system 1300 may include at least one processor 1302 coupled to memory elements 1304 through a system bus 1306. As such, the data processing system may store program code within memory elements 1304. Further, the processor 1302 may execute the program code accessed from the memory elements 1304 via a system bus 1306. In one aspect, the data processing system may be implemented as a computer that is suitable for storing and/or executing program code. It should be appreciated, however, that the data processing system 1300 may be implemented in the form of any system including a processor and a memory that is capable of performing the functions described within this specification.

The memory elements 1304 may include one or more physical memory devices such as, for example, local memory 1308 and one or more bulk storage devices 1310. The local memory may refer to random access memory or other non-persistent memory device(s) generally used during actual execution of the program code. A bulk storage device may be implemented as a hard drive or other persistent data storage device. The processing system 1300 may also include one or more cache memories (not shown) that provide temporary storage of at least some program code in order to reduce the number of times program code must be retrieved from the bulk storage device 1310 during execution.

Input/output (I/O) devices depicted as an input device 1312 and an output device 1314, optionally, can be coupled to the data processing system. Examples of input devices may include, but are not limited to, a keyboard, a pointing device such as a mouse, or the like. Examples of output devices may include, but are not limited to, a monitor or a display, speakers, or the like. Input and/or output devices may be coupled to the data processing system either directly or through intervening I/O controllers.

In an embodiment, the input and the output devices may be implemented as a combined input/output device (illustrated in FIG. 13 with a dashed line surrounding the input device 1312 and the output device 1314). An example of such a combined device is a touch sensitive display, also sometimes referred to as a "touch screen display" or simply "touch screen". In such an embodiment, input to the device may be provided by a movement of a physical object, such as e.g. a stylus or a finger of a user, on or near the touch screen display.

A network adapter 1316 may also, optionally, be coupled to the data processing system to enable it to become coupled to other systems, computer systems, remote network devices, and/or remote storage devices through intervening private or public networks. The network adapter may comprise a data receiver for receiving data that is transmitted by said systems, devices and/or networks to the data processing system 1300, and a data transmitter for transmitting data from the data processing system 1300 to said systems, devices and/or networks. Modems, cable modems, and Ethernet cards are examples of different types of network adapter that may be used with the data processing system 1300.

As pictured in FIG. 13, the memory elements 1304 may store an application 1318. In various embodiments, the application 1318 may be stored in the local memory 1308, the one or more bulk storage devices 1310, or apart from the local memory and the bulk storage devices. It should be appreciated that the data processing system 1300 may further execute an operating system (not shown in FIG. 13) that can facilitate execution of the application 1318. The application 1318, being implemented in the form of executable program code, can be executed by the data processing system 1300, e.g., by the processor 1302. Responsive to executing the application, the data processing system 1300 may be configured to perform one or more operations or method steps described herein.

Exemplary Applications

Figure 14:
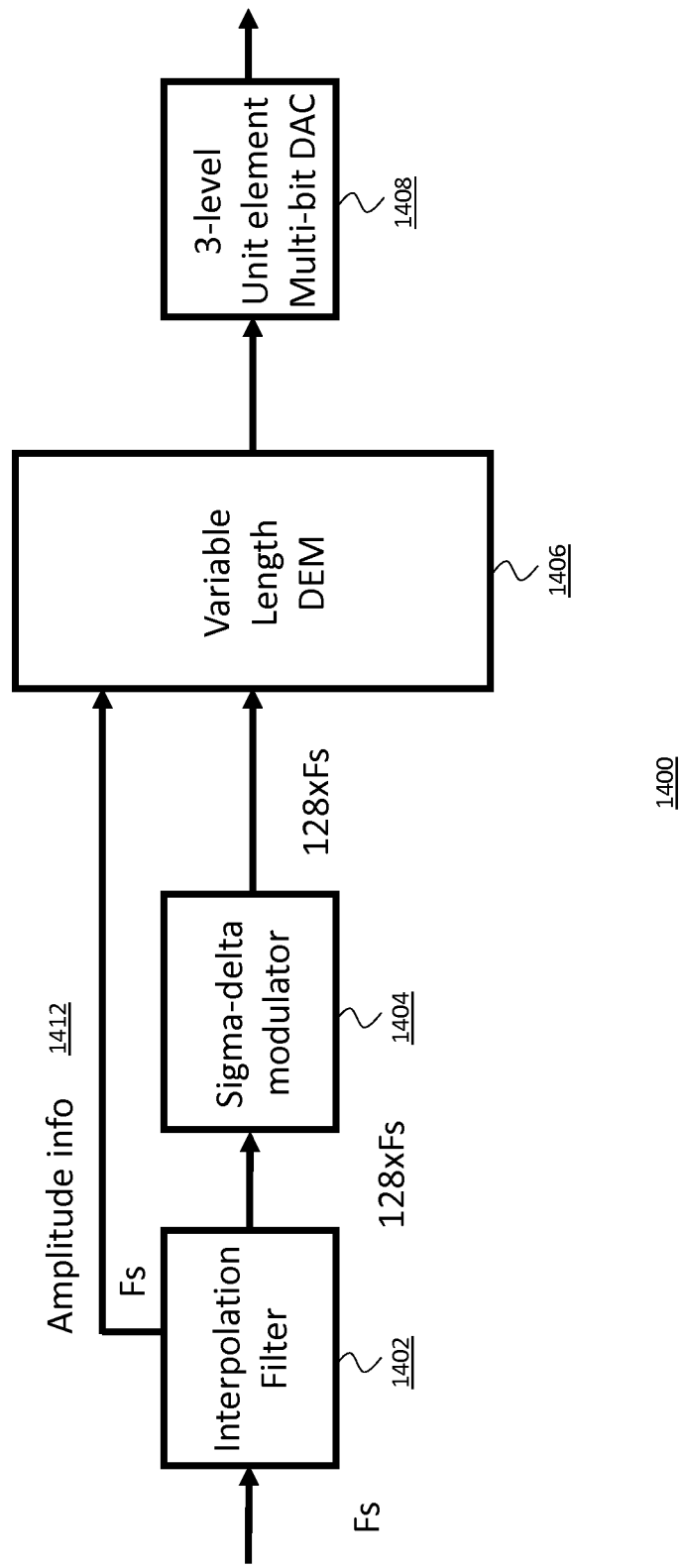
FIG. 14 illustrates an exemplary implementation of a DAC to which a variable length DEM utilizing an interpolator as described herein is applied, according to some embodiments of the disclosure.

As previously described herein, the controller 306 may be configured to determine the range of amplitudes of the input signal using e.g. a look-ahead functionality provided in another digital engine, e.g. in an interpolator, or by using an additional digital peak detector. An application of using an interpolator is shown in FIG. 14. An application of using a peak detector is shown in FIGS. 15 and 16.

FIG. 14 illustrates an exemplary implementation 1400 of a DAC to which a variable length DEM utilizing an interpolator as described herein is applied, according to some embodiments of the disclosure. As shown in FIG. 14, an interpolator 1402 used for providing an interpolated signal to a sigma-delta modulator 1404 prior to providing the input digital signal to a multi-bit DAC 1408, e.g. a three-level multi-bit DAC, may be configured to provide information 1412 indicative of the amplitudes of the digital signal to a controller 1406 configured to implement variable length DEM as described herein. The controller 1406 may comprise the controller 306 described herein.

Figure 15:
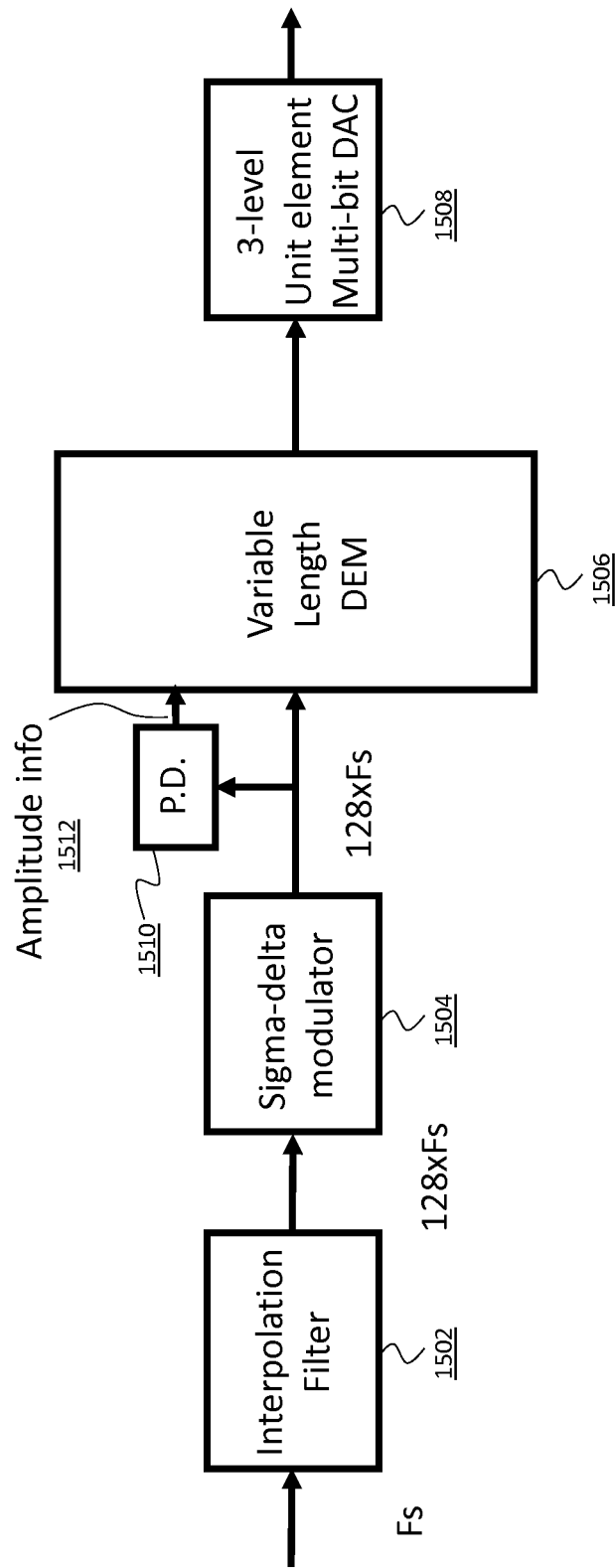
FIG. 15 illustrates an exemplary implementation of a DAC to which a variable length DEM utilizing a peak detector as described herein is applied, according to some embodiments of the disclosure.

FIG. 15 illustrates an exemplary implementation 1500 of a DAC to which a variable length DEM utilizing a peak detector as described herein is applied, according to some embodiments of the disclosure. As shown in FIG. 15, an interpolator 1502 is used for providing an interpolated signal to a sigma-delta modulator 1504 prior to providing the input digital signal to a multi-bit DAC 1508, e.g. a three-level multi-bit DAC, and a controller 1506 is used to implement variable length DEM as described herein. The controller 1506 may comprise the controller 306 described herein. In addition, as shown in FIG. 15, a peak detector 1510 may be used, the peak detector 1510 configured to provide information indicative of the amplitudes of the digital signal to the controller 1506.

Figure 16:
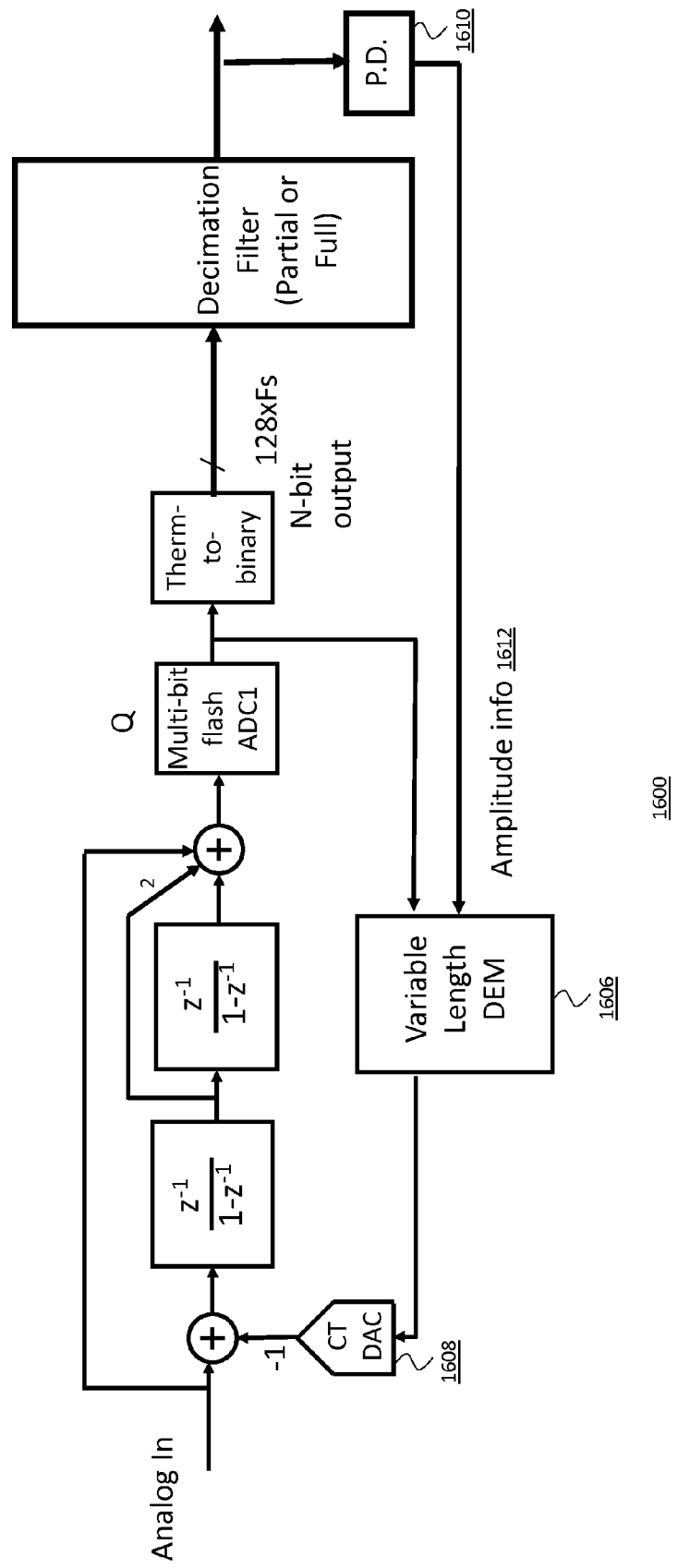
FIG. 16 illustrates an exemplary implementation of an ADC comprising a DAC to which a variable length DEM utilizing a peak detector as described herein is applied, according to some embodiments of the disclosure.

FIG. 16 illustrates an exemplary implementation 1600 of an ADC comprising a DAC to which a variable length DEM utilizing a peak detector as described herein is applied, according to some embodiments of the disclosure. As shown in FIG. 16, a peak detector 1610 is used for providing information 1612 indicative of the amplitudes of the digital signal to a controller 1606 used to implement variable length DEM as described herein, the controller 1606 controlling application of DEM techniques in a DAC 1608, shown in the example of FIG. 16 as a continuous time (CT) DAC. The controller 1606 may comprise the controller 306 described herein.

Of course, in various embodiments, implementation of an interpolator or a peak detector used to provide information from which the number of DAC cells to be used for the application of DEM techniques is not limited to implementing other elements shown in FIGS. 114-16. For example, DACs could be of different types, different modulators could be used to provide an input signal to the DAC, different ADC architecture could be used, etc.

Variations and Implementations

While embodiments of the present disclosure were described above with references to exemplary implementations as shown in FIGS. 1-13, a person skilled in the art will realize that the various teachings described above are applicable to a large variety of other implementations. For example, while some descriptions provided in the present disclosure refer to thermometer coding, these descriptions are equally applicable to other coding methods used in DACs. Further, while examples provided herein are described with reference to a DAC comprising 8 or 16 DAC units, of course in other implementations any other number of DAC units could be used.

Embodiments of the present disclosure may be particularly advantageous for oversampling, or interpolating, DACs, such as e.g. sigma-delta DACs, because of their high speed. However, the techniques presented herein are not limited to oversampling DACs as they are equally applicable, possibly with modifications that would be apparent to a person of ordinary skill in the art, to other types of DACs, such as e.g. Nyquist DACs.

Furthermore, while only current steering DACs are illustrated in the FIGURES, embodiments of the present disclosure are equally applicable to other circuit architectures, e.g. to switched capacitor DACs. In switched capacitor DACs, DAC cells not selected for the conversion of digital input values and application of DEM techniques may be connected to reference voltages.

Besides being particularly advantageous for three-level DACs, embodiments of the present disclosure are applicable to two-level DACs, implemented using either current steering or switched capacitor architecture. For two-level switched capacitor DAC architectures, implementation of some embodiments of the present disclosure may allow saving dynamic power drawn from reference voltage. For two-level current steering DAC architectures, implementation of some embodiments of the present disclosure may allow reducing dynamic mismatch error.

Still further, embodiments of the present disclosure may be used in stand-alone DACs as well as in embedded feedback DACs in analog-to-digital converter (ADC) designs.

In certain contexts, the features discussed herein can be applicable to automotive systems, safety-critical industrial applications, medical systems, scientific instrumentation, wireless and wired communications, radar, industrial process control, audio and video equipment, current sensing, instrumentation (which can be highly precise), and other digital-processing-based systems.

Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind).

In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions.

In the discussions of the embodiments above, components of a system, such as e.g. clocks, multiplexers, buffers, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure related to improved switching techniques.

Parts of various systems for implementing improved mechanisms for applying DEM techniques as proposed herein can include electronic circuitry to perform the functions described herein. In some cases, one or more parts of the system can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed signal domain. In some instances, the processor may be configured to carrying out the functions described herein by executing one or more instructions stored on a non-transitory computer readable storage medium.

In one example embodiment, any number of electrical circuits of FIGS. 1-13 may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of FIGS. 3-13 may be implemented as stand-alone modules (e.g., a device with associated components and circuitry configured to perform a specific application or function) or implemented as plug-in modules into application specific hardware of electronic devices. Note that particular embodiments of the present disclosure implementing improved mechanisms for applying DEM techniques may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the functionalities of improved mechanisms for applying DEM techniques proposed herein may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of FIGS. 3-13 may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of FIGS. 3-13 and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to the improved mechanisms for applying DEM techniques as proposed herein illustrate only some of the possible functions that may be executed by, or within, system illustrated in FIGS. 3-13. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

Although the claims are presented in single dependency format in the style used before the USPTO, it should be understood that any claim can depend on and be combined with any preceding claim of the same type unless that is clearly technically infeasible.

Note that all optional features of the apparatus described above may also be implemented with respect to the method or process described herein and specifics in the examples may be used anywhere in one or more embodiments.

What is claimed is:

1. A controller for controlling application of one or more dynamic element matching (DEM) techniques in a digital-to-analog converter (DAC) comprising a plurality of DAC cells, the controller comprising:
   means for determining a range of amplitudes of at least a portion of an input signal provided or to be provided to the DAC;
   means for determining whether the range of amplitudes of the portion of the input signal is smaller than a threshold value;
   when it is determined that the range of amplitudes of the portion of the input signal is smaller than the threshold value, means for determining a number of DAC cells, less than a number of the plurality of DAC cells, based on the threshold value; and
   means for limiting application of the one or more DEM techniques to the determined number of DAC cells.

2. The controller according to claim 1, wherein:
   the threshold value is one of a plurality of threshold values,
   determining whether the range of amplitudes of the portion of the input signal is smaller than the threshold value comprises determining whether the range of amplitudes of the portion of the input signal is smaller than the threshold value for two or more of the plurality of threshold values, and
   the controller further comprises means for determining the number of DAC cells based on the smallest threshold value of the plurality of threshold values for which it was determined that the range of amplitudes of the portion of the input signal is smaller than the threshold value.

3. The controller according to claim 2, wherein the plurality of threshold values comprise predefined threshold values and the number of DAC cells corresponding to the determined range of amplitudes of the portion of the input signal is one of predefined numbers of DAC cells corresponding to one of the predefined threshold values.

4. The controller according to claim 1, further comprising means for:
   following the limitation of the application of the one or more DEM techniques to the determined number of DAC cells, determining a further range of amplitudes of a further portion of the input signal and removing the limitation when the further range of amplitudes is determined to be equal to or greater than the threshold value.

5. The controller according to claim 1, wherein the threshold value is equal to a full scale of the DAC or a fraction of the full scale of the DAC.

6. A digital-to-analog converter (DAC) comprising:
a plurality of DAC cells, and
a controller for controlling application of one or more dynamic element matching (DEM) techniques in the DAC, the controller configured to:
 determine a range of amplitudes of at least a portion of an input signal provided or to be provided to the DAC;
 determine that the range of amplitudes of the portion of the input signal is smaller than a threshold value;
 determine a number of DAC cells, less than a number of the plurality of DAC cells, based on the threshold value; and
 limit application of the one or more DEM techniques to the determined number of DAC cells.

7. The DAC according to claim 6, wherein:
the threshold value is one of a plurality of threshold values,
determining whether the range of amplitudes of the portion of the input signal is smaller than the threshold value comprises determining whether the range of amplitudes of the portion of the input signal is smaller than the threshold value for two or more of the plurality of threshold values, and
the controller is configured to determine the number of DAC cells based on the smallest threshold value of the plurality of threshold values for which it was determined that the range of amplitudes of the portion of the input signal is smaller than the threshold value.

8. The DAC according to claim 7, wherein the plurality of threshold values comprise predefined threshold values and the number of DAC cells corresponding to the determined range of amplitudes of the portion of the input signal is one of predefined numbers of DAC cells corresponding to one of the predefined threshold values.

9. The DAC according to claim 6, wherein the controller is further configured to:
following the limitation of the application of the one or more DEM techniques to the determined number of DAC cells, determine a further range of amplitudes of a further portion of the input signal and removing the limitation when the further range of amplitudes is determined to be equal to or greater than the threshold value.

10. The DAC according to claim 6, wherein the threshold value is equal to a full scale of the DAC or a fraction of the full scale of the DAC.

11. A method for controlling application of one or more dynamic element matching (DEM) techniques in a digital-to-analog converter (DAC) comprising a plurality of DAC cells, the method comprising:
determining a range of amplitudes of at least a portion of an input signal provided or to be provided to the DAC;
determining that the range of amplitudes of the portion of the input signal is smaller than a threshold value;
determining a number of DAC cells, less than a number of the plurality of DAC cells, based on the threshold value; and
limiting application of the one or more DEM techniques to the determined number of DAC cells.

12. The method according to claim 11, wherein:
the threshold value is one of a plurality of threshold values,
determining whether the range of amplitudes of the portion of the input signal is smaller than the threshold value comprises determining whether the range of amplitudes of the portion of the input signal is smaller than the threshold value for two or more of the plurality of threshold values, and
the method further comprises determining the number of DAC cells based on the smallest threshold value of the plurality of threshold values for which it was determined that the range of amplitudes of the portion of the input signal is smaller than the threshold value.

13. The method according to claim 12, wherein the plurality of threshold values comprise predefined threshold values and the number of DAC cells corresponding to the determined range of amplitudes of the portion of the input signal is one of predefined numbers of DAC cells corresponding to one of the predefined threshold values.

14. The method according to claim 11, further comprising:
following the limitation of the application of the one or more DEM techniques to the determined number of DAC cells, determining a further range of amplitudes of a further portion of the input signal and removing the limitation when the further range of amplitudes is determined to be equal to or greater than the threshold value.

15. A controller for controlling application of one or more dynamic element matching (DEM) techniques in a digital-to-analog converter (DAC) comprising a plurality of DAC cells, the controller comprising:
means for determining a range of amplitudes of at least a portion of an input signal provided or to be provided to the DAC;
means for determining a number of DAC cells, less than a number of the plurality of DAC cells, corresponding to the determined range of amplitudes of the portion of the input signal; and
means for limiting application of the one or more DEM techniques to the determined number of DAC cells starting from a time when a cumulative error due to mismatch of the plurality of DAC cells satisfies one or more criteria.

16. The controller according to claim 15, wherein the one or more criteria comprises the cumulative error being equal to zero or the cumulative error being within a predefined range, the predefined range comprising zero.

17. A digital-to-analog converter (DAC) comprising:
a plurality of DAC cells, and
a controller for controlling application of one or more dynamic element matching (DEM) techniques in the DAC, the controller configured to:
 determine a range of amplitudes of at least a portion of an input signal provided or to be provided to the DAC;
 determine a number of DAC cells, less than a number of the plurality of DAC cells, corresponding to the determined range of amplitudes of the portion of the input signal; and
 limit application of the one or more DEM techniques to the determined number of DAC cells starting from a time when a cumulative error due to mismatch of the plurality of DAC cells satisfies one or more criteria.

18. The DAC according to claim 17, wherein the one or more criteria comprises the cumulative error being equal to zero or the cumulative error being within a predefined range, the predefined range comprising zero.

19. The DAC according to claim 17, wherein:
the plurality of DAC cells comprises three-level DAC cells,
the DAC comprises a signed thermometer encoder for converting a plurality of signed binary data received at the encoder into a plurality of signed thermometer data, wherein positive binary data are converted into positive thermometer data and negative binary data are converted into negative thermometer data, and
the controller is further configured to determine that the cumulative error satisfies the one or more criteria when a starting position of next positive thermometer data is the same as a starting position of next negative thermometer data.

20. The DAC according to claim 17, wherein:
the plurality of DAC cells comprises two-level DAC cells, and
the controller is further configured to determine that the cumulative error satisfies the one or more criteria when a current pointer indicating a starting position of applying the one or more DEM techniques overlaps a predefined reference pointer.

21. A method for controlling application of one or more dynamic element matching (DEM) techniques in a digital-to-analog converter (DAC) comprising a plurality of DAC cells, the method comprising:
determining a range of amplitudes of at least a portion of an input signal provided or to be provided to the DAC;
determining a number of DAC cells, less than a number of the plurality of DAC cells, corresponding to the determined range of amplitudes of the portion of the input signal; and
limiting application of the one or more DEM techniques to the determined number of DAC cells starting from a time when a cumulative error due to mismatch of the plurality of DAC cells satisfies one or more criteria.

22. The method according to claim 21, wherein the one or more criteria comprises the cumulative error being equal to zero or the cumulative error being within a predefined range, the predefined range comprising zero.

23. The method according to claim 21, wherein:
the plurality of DAC cells comprises three-level DAC cells,
the DAC comprises a signed thermometer encoder for converting a plurality of signed binary data received at the encoder into a plurality of signed thermometer data, wherein positive binary data are converted into positive thermometer data and negative binary data are converted into negative thermometer data, and
the method further comprises determining that the cumulative error satisfies the one or more criteria when a starting position of next positive thermometer data is the same as a starting position of next negative thermometer data.

24. The method according to claim 21, wherein:
the plurality of DAC cells comprises two-level DAC cells, and
the method further comprises determining that the cumulative error satisfies the one or more criteria when a current pointer indicating a starting position of applying the one or more DEM techniques overlaps a predefined reference pointer.

25. A controller for controlling application of one or more dynamic element matching (DEM) techniques in a digital-to-analog converter (DAC) comprising a plurality of DAC cells, the plurality of DAC cells comprising three-level DAC cells, the controller comprising:
means for determining a range of amplitudes of at least a portion of an input signal provided or to be provided to the DAC;
means for determining a number of DAC cells, less than a number of the plurality of DAC cells, corresponding to the determined range of amplitudes of the portion of the input signal;
means for limiting application of the one or more DEM techniques to the determined number of DAC cells; and
means for turning DAC cells unused for the limited application of the one or more DEM techniques off.

26. The controller according to claim 25, further comprising means for:
following the limitation of the application of the one or more DEM techniques to the determined number of DAC cells, determining a further range of amplitudes of a further portion of the input signal and removing the limitation when the further range of amplitudes is determined to be equal to or greater than a threshold value.

27. A digital-to-analog converter (DAC) comprising:
a plurality of DAC cells, the plurality of DAC cells comprising three-level DAC cells, and
a controller for controlling application of one or more dynamic element matching (DEM) techniques in the DAC, the controller configured to:
determine a range of amplitudes of at least a portion of an input signal provided or to be provided to the DAC;
determine a number of DAC cells, less than a number of the plurality of DAC cells, corresponding to the determined range of amplitudes of the portion of the input signal;
limit application of the one or more DEM techniques to the determined number of DAC cells; and
turn DAC cells unused for the limited application of the one or more DEM techniques off.

28. The DAC according to claim 27, wherein the controller is further configured to:
following the limitation of the application of the one or more DEM techniques to the determined number of DAC cells, determine a further range of amplitudes of a further portion of the input signal and remove the limitation when the further range of amplitudes is determined to be equal to or greater than a threshold value.

29. A method for controlling application of one or more dynamic element matching (DEM) techniques in a digital-to-analog converter (DAC) comprising a plurality of DAC cells, the plurality of DAC cells comprising three-level DAC cells, the method comprising:
determining a range of amplitudes of at least a portion of an input signal provided or to be provided to the DAC;
determining a number of DAC cells, less than a number of the plurality of DAC cells, corresponding to the determined range of amplitudes of the portion of the input signal;
limiting application of the one or more DEM techniques to the determined number of DAC cells; and
turning DAC cells unused for the limited application of the one or more DEM techniques off.

30. The method according to claim 29, further comprising:
- following the limitation of the application of the one or more DEM techniques to the determined number of DAC cells, determining a further range of amplitudes of a further portion of the input signal and removing the limitation when the further range of amplitudes is determined to be equal to or greater than a threshold value.

* * * * *